United States Patent [19]
Yoshizaki et al.

[11] Patent Number: 5,834,948
[45] Date of Patent: Nov. 10, 1998

[54] OUTPUT CIRCUIT

[75] Inventors: Shoichi Yoshizaki; Hisanori Yuki, both of Osaka, Japan

[73] Assignee: Matsushita Electric Industrial Co.,Ltd., Osaka, Japan

[21] Appl. No.: 710,544

[22] Filed: Sep. 19, 1996

[30] Foreign Application Priority Data

Sep. 21, 1995 [JP] Japan .................................. 7-242894

[51] Int. Cl.⁶ .............................................. H03K 19/0185
[52] U.S. Cl. .................................. 326/81; 326/58; 326/86
[58] Field of Search ................................ 326/68, 80–81, 326/57–58, 83, 86; 327/333

[56] References Cited

U.S. PATENT DOCUMENTS

| | | | |
|---|---|---|---|
| 4,709,162 | 11/1987 | Braceras et al. | 326/81 |
| 5,151,619 | 9/1992 | Austin et al. | 326/86 |
| 5,243,236 | 9/1993 | McDaniel . | |
| 5,300,802 | 4/1994 | Rogers | 326/68 |
| 5,440,249 | 8/1995 | Schucker et al. | 326/81 |
| 5,506,535 | 4/1996 | Ratner | 326/81 |
| 5,537,059 | 7/1996 | Asahina | 326/81 |
| 5,559,464 | 9/1996 | Orii et al. | 326/81 |

FOREIGN PATENT DOCUMENTS

| | | |
|---|---|---|
| 0 703 665 | 9/1995 | European Pat. Off. . |
| 7-111449 | 4/1995 | Japan . |
| 7-074616 | 7/1995 | Japan . |
| 95 19660 | 7/1995 | WIPO . |

*Primary Examiner*—Jon Santamauro
*Attorney, Agent, or Firm*—McDermott, Will & Emery

[57] ABSTRACT

An output circuit serving as an interface between an LSI and an external LSI, even though the power voltage of the external LSI is not less than the withstand voltage of the gate oxide layer of each of the MOS transistors forming the output circuit, can supply, from the output unit thereof, a signal of which amplitude is equal to the power voltage of the external LSI without a voltage not less than the withstand voltage above-mentioned applied to the gate oxide layer of each of the MOS transistors. A pull-up circuit for pulling up the potential of the output unit comprises first and second PMOSs being connected in series between the power of the external LSI and the output unit, the first PMOS receiving a pull-up control signal at the gate thereof. A pull-down circuit for pulling down the potential of the output unit comprises first and second NMOSs being connected in series between the output unit and the ground, the first NMOS receiving a pull-down control signal $S_d$ at the gate thereof. A voltage conversion circuit is arranged such that, when pulling up the potential of the output unit, there is supplied the pull-up control signal having such a potential with which the first PMOS is turned on and with which a voltage not less than the withstand voltage of the gate oxide layer is not applied to the gate oxide layer.

14 Claims, 12 Drawing Sheets

OUTPUT CIRCUIT

[BACKGROUND OF THE INVENTION]

The present invention relates to a semiconductor integrated circuit (LSI) comprising MOS transistors, and more particularly to an output circuit serving as an interface to be connected to another LSI of which power voltage is not less than the Withstand voltage of the gate oxide layer of each of the MOS transistors.

With the recent miniaturization of a semiconductor integrated circuit, there is lowered the withstand voltage of a semiconductor device, particularly the withstand voltage of the gate oxide layer of each MOS transistor. Thus, there are increasingly prevailing LSIs each of which power voltage is as low as 3V or less. However, there are instances where such an LSI having a power voltage of 3V is connected to an external LSI of which power voltage is 5V for example. In such a case, there is required an output circuit for supplying a voltage of 5V obtained by converting the power voltage of 3V.

With reference to FIGS. 13 to 15, the following description will discuss an output circuit of prior art in which the potential of the output pad unit thereof is set to any of the power potential of an external LSI, the grounding potential and high impedance.

FIG. 13 is a circuit diagram illustrating the arrangement of such an output circuit of prior art. Shown in FIG. 13 are an output pad unit OUT to which a signal line of an external LSI is to be connected, an input terminal IN for receiving a signal from an on-chip circuit and an enable terminal EN for receiving an enable signal, these terminals IN and EN being output control terminals for controlling the potential of the output pad unit OUT. A first potential VDD1 has a value which is not greater than the withstand voltage of the gate oxide layer of each of the MOS transistors forming the LSI and which is for example 3V, and a VDD2 is a second potential which is the power potential of an external LSI and which is for example 5V.

A signal generation circuit 110 is arranged to generate a pull-up control signal and a pull-down control signal according to the potentials of the output control terminals IN, EN, and comprises a NAND gate 11 and a NOR gate 12. The first potential VDD1 is given, as the power potential, to the NAND gate 11 and the NOR gate 12 which are operable with a voltage not greater than the withstand voltage of the gate oxide layer of each MOS transistor.

A voltage conversion circuit 120 is arranged to supply a pull-up control signal entered from the signal generation circuit 110 with the voltage thereof raised, and comprises P-MOS transistors 21, 22, N-MOS transistors 23, 24 and an inverter circuit 29 for inverting the logic of a signal. The second potential VDD2 is given to the sources of the P-MOS transistors 21, 22. The drain of the P-MOS transistor 21 is connected to the drain of the N-MOS transistor 23, the drain of the P-MOS transistor 22 is connected to the drain of the N-MOS transistor 24 and the sources of the N-MOS transistors 23, 24 are grounded.

The pull-up control signal entered from the signal generation circuit 110 is entered into the gate of the N-MOS transistor 23, and the pull-up control signal is entered, as inverted by the inverter circuit 29, to the N-MOS transistor 24. The gate of the P-MOS transistor 21 is connected to the drain of the P-MOS transistor 22 (the drain of the N-MOS transistor 24) at a node B, and the gate of the P-MOS transistor 22 is connected to the drain of the P-MOS transistor 21 (the drain of the N-MOS transistor 23) at a node A. The pull-up control signal with the voltage thereof raised, is supplied from the node B. As the power potential, the first potential VDD1 is given to the inverter circuit 29.

A pull-up circuit 130 comprises a P-MOS transistor 31. In the P-MOS transistor 31, the gate is connected to the node B of the voltage conversion circuit 120, the second potential VDD2 is given to the source and the substrate, and the drain is connected to the output pad unit OUT. Thus, while the P-MOS transistor 31 is being turned on, the potential of the output pad unit OUT is pulled up to the level of the second potential VDD2.

A pull-down circuit 140 comprises an N-MOS transistor 41. In the N-MOS transistor 41, an output signal of the NOR gate 12 in the signal generation circuit 110 is applied to the gate, both the source and the substrate are grounded, and the drain is connected to the output pad unit OUT. Thus, while the N-MOS transistor 41 is being turned on, the potential of the output pad unit OUT is pulled down to the level of the grounding potential.

With reference to FIGS. 14 and 15, the following description will discuss the operation of the output circuit of prior art having the arrangement above-mentioned shown in FIG. 13. In the following specification, the high level (high potential) of a digital signal will be referred to as "H", and the low level (low potential) will be referred to as "L". Further, the value of a potential will be put in the form of, for example, "H" (3V) as necessary. In the following, it is supposed that the first potential VDD1 is equal to 3V and the second potential VDD2 is equal to 5V.

With reference to FIG. 14, the following description will first discuss the operation when "H" (5V) is to be supplied from the output pad unit OUT. In this case, an enable signal of "H" (3V) is entered into the enable terminal EN and an input signal of "H" (3V) is entered into the input terminal IN.

Then, the potential of the output signal of the NAND gate 11 becomes "L" (0V) and the potential of the output signal of the NOR gate 12 also becomes "L" (0V). When the potential of the output signal of the NAND gate 11 becomes 0V, the gate potential of the N-MOS transistor 23 becomes 0V and the gate potential of the N-MOS transistor 24 becomes 3V since the gate of the N-MOS transistor 24 is connected to the NAND gate 11 through the inverter circuit 29. Accordingly, the N-MOS transistor 23 is turned off and the N-MOS transistor 24 is turned on. When the N-MOS transistor 24 is turned on, the potential of the node B is lowered. This lowers the gate potential of the P-MOS transistor 21, causing the same to be turned on. Since the P-MOS transistor 21 is turned on and the N-MOS transistor 23 is turned off, the potential of the node A becomes 5V. Accordingly, the P-MOS transistor 22 is turned off. On the other hand, the N-MOS transistor 24 is turned on. Thus, the potential of the node B becomes 0V.

When the potential of the node B becomes 0V, the P-MOS transistor 31 is turned on since its gate potential becomes 0V, and the N-MOS transistor 41 is turned off since the potential of the output signal of the NOR gate 12 is 0V and the gate potential therefore becomes 0V. Since the P-MOS transistor 31 is turned on, the N-MOS transistor 41 is turned off and the second potential VDD2 is given to the source of the P-MOS transistor 31, the potential of the output pad unit OUT becomes "H" (5V). Thus, when the enable signal of "H" (3V) is entered into the enable terminal EN and the input signal of "H" (3V) is entered to the input terminal IN, the output pad unit OUT supplies "H" (5V). In FIG. 14, there is surrounded, by a circle in a broken line, each MOS transistor which is turned on when "H" (5V) is supplied from the output pad unit OUT.

With reference to FIG. 15, the following description will then discuss the operation when "L" (0V) is to be supplied from the output pad unit OUT. In this case, an enable signal of "H" (3V) is entered into the enable terminal EN and an input signal of "L" (0V) is entered into the input terminal IN.

Then, the potential of the output signal of the NAND gate 11 becomes "H" (3V) and the potential of the output signal of the NOR gate 12 also becomes "H" (3V). When the potential of the output signal of the NAND gate 11 becomes 3V, the gate potential of the N-MOS transistor 23 becomes 3V and the gate potential of the N-MOS transistor 24 becomes 0V since the gate thereof is connected to the NAND gate 11 through the inverter circuit 29. Accordingly, the N-MOS transistor 23 is turned on and the N-MOS transistor 24 is turned off. When the N-MOS transistor 23 is turned on, the potential of the node A is lowered. This lowers the gate potential of the P-MOS transistor 22, causing the same to be turned on. Since the P-MOS transistor 22 is turned on and the N-MOS transistor 24 is turned off, the potential of the node B becomes 5V. Accordingly, the P-MOS transistor 21 is turned off. On the other hand, the N-MOS transistor 23 is turned on. Thus, the potential of the node A becomes 0V.

The P-MOS transistor 31 is turned off because its gate potential or the node B potential becomes 5V. The N-MOS transistor 41 is turned on since the potential of the output signal of the NOR gate 12 is 3V and the gate potential therefore becomes 3V. Since the P-MOS transistor 31 is turned off, the N-MOS transistor 41 is turned on and the source of the N-MOS transistor 41 is grounded, the potential of the output pad unit OUT becomes "L" (0V). Thus, when the enable signal of "H" (3V) is entered into the enable terminal EN and the input signal of "L" (0V) is entered into the input terminal IN, the output pad unit OUT supplies "L" (0V). In FIG. 15, there is surrounded, by a circle in a broken line, each MOS transistor which is turned on when "L" (0V) is supplied from the output pad unit OUT.

The following description will then discuss the operation when the output pad unit OUT is to be brought to a high impedance state. In this case, an enable signal to be entered into the enable terminal EN is brought to "L" regardless of the logical value of a signal entered into the input terminal IN.

Then, the potential of the output signal of the NAND gate 11 becomes "H" (3V) and the potential of the output signal of the NOR gate 12 becomes "L" (0V). Since the potential of the output signal of the NAND gate 11 is equal to 3V, the P-MOS transistor 31 is turned off by an operation similar to that executed when "L" is to be supplied from the output pad unit OUT. Since the output signal of the NOR gate 12 is equal to 0V, the N-MOS transistor 41 is turned off by an operation similar to that executed when "H" is to be supplied from the output pad unit OUT. Accordingly, each of the P-MOS transistor 31 and the N-MOS transistor 41 is turned off such that the output pad unit OUT is brought to an high impedance state.

However, this output circuit of prior art has the following problems.

In the output circuit of prior art shown in FIG. 13, a voltage equal to the difference between the second potential VDD2 and the grounding potential, or to the power voltage of an external LSI, is applied to a MOS transistor across the gate and drain thereof or the gate and source thereof. In a MOS transistor, the voltage across the gate and the drain or the voltage across the gate and the source is structurally applied to the gate oxide layer. Accordingly, when the power voltage of an external LSI is not less than the withstand voltage of the gate oxide layer, the gate oxide layer is broken or deteriorated.

For example, when the output pad unit OUT is to supply "H" (5V), the gate potential of the N-MOS transistor 41 forming the pull-down circuit 140 is brought to 0V in order to turn off the N-MOS transistor 41, and the gate potential of the P-MOS transistor 31 forming the pull-up circuit 130 is brought to 0V in order to turn on the P-MOS transistor 31. In the N-MOS transistor 41, the voltage across the gate and the drain becomes 5V because the gate potential becomes 0V and the drain connected to the output pad unit OUT becomes 5V. Similarly, in the P-MOS transistor 31, the voltage across the gate and the source becomes 5V. Accordingly, a voltage not less than the withstand voltage (5V) is applied to the gate oxide layer of each of the N-MOS transistor 41 and the P-MOS transistor 31.

Also, a voltage not less than the withstand voltage is applied to the gate oxide layer of each of the MOS transistors forming the voltage conversion circuit 120. In the N-MOS transistor 23 for example, the voltage across the gate and the drain becomes 5V since the gate potential becomes 0V and the potential of the drain connected to the node A becomes 5V. In the P-MOS transistor 22, the voltage across the gate and the drain becomes 5V since the potential of the gate connected to the node A becomes 5V and the potential of the drain connected to the node B becomes 0V. In the P-MOS transistor 21, the voltage across the gate and the source becomes 5V since the second potential VDD2 of 5V has been given to the source and the potential of the gate connected to the node B becomes 0V.

When "L" is to be supplied from the output pad unit OUT, the potential of the node B becomes 5V and the potential of the output pad unit OUT becomes 0V. Therefore, the voltage across the gate and the drain of the P-MOS transistor 31 becomes 5V. Consideration will now be made on the voltage conversion circuit 120. In the N-MOS transistor 24, the voltage across the gate and the drain becomes 5V since the gate potential becomes 0V and the potential of the drain connected to the node B becomes 5V. In the P-MOS transistor 21, the voltage across the gate and the drain becomes 5V since the potential of the gate connected to the node B becomes 5V and the potential of the drain connected to the node A becomes 0V. In the P-MOS transistor 22, the voltage across the gate and the source becomes 5V since the second potential VDD2 of 5V has been given to the source and the potential of the gate connected to the node A becomes 0V.

Further, when bringing the output pad unit OUT to a high impedance state, too, similar problems will arise. Since the gate potential of the P-MOS transistor 31 becomes 5V, the voltage across the gate and the drain becomes 5V when 0V is applied to the output pad unit OUT. Further, since the gate potential of the N-MOS transistor 41 becomes 0V, the voltage across the gate and the drain becomes 5V when 5V is applied to the output pad unit OUT.

Thus, the output circuit of prior art is disadvantageous in that, when the power voltage of an external LSI connected to the output circuit is not less than the withstand voltage of the gate oxide layer of each of the MOS transistors forming the output circuit, a voltage not less than the withstand voltage is inevitably applied to the gate oxide layer of each MOS transistor, causing the gate oxide layer to be broken or deteriorated. Such a problem can be avoided by using MOS transistors each having a great gate-oxide-layer withstand voltage. However, the use of MOS transistors each having a great gate-oxide-layer withstand voltage disadvantageously prevents the miniaturization of the resulting semiconductor integrated circuit.

[SUMMARY OF THE INVENTION]

An output circuit serving as an interface to be connected to an external LSI is arranged such that, even though the power voltage of the external LSI is not less than the withstand voltage of the gate oxide layer of each of the MOS transistors forming the output circuit, the output circuit can supply a signal of which amplitude is equal to the power voltage of the external LSI, without a voltage not less than the withstand voltage above-mentioned applied to the gate oxide layer of each of the MOS transistors.

More specifically, the present invention provides an output circuit arranged to receive an output signal from one circuit having a first potential as its power potential and to supply, according to the output signal thus received, a signal from the output unit thereof to another circuit having a second potential as its power potential, and this output circuit comprises: a signal generation circuit for generating, based on the output signal entered from the one circuit, first and second control signals each of which amplitude is equal to the difference between the first potential and the grounding potential; a voltage conversion circuit for receiving the first control signal generated by the signal generation circuit, and for converting the amplitude of the first control signal to generate and supply a pull-up control signal; a pull-up circuit arranged to receive the pull-up control signal supplied from the voltage conversion circuit and to pull up or not to pull up the potential of the output unit to the second potential dependent on the instruction of the pull-up control signal; and a pull-down circuit arranged to receive, as a pull-down control signal, the second control signal generated by the signal generation circuit and to pull down or not to pull down the potential of the output unit to the grounding potential dependent on the instruction of the pull-down control signal. According to the present invention, the pull-up circuit comprises: a first P-MOS transistor to the source of which the second potential is given and to the gate of which the pull-up control signal is entered; and a second P-MOS transistor of which source is connected to the drain of the first P-MOS transistor, of which drain is connected to the output unit and to the gate of which a third potential is applied, the pull-down circuit comprises: a first N-MOS transistor of which source is grounded and to the gate of which the pull-down control signal is entered; and a second N-MOS transistor of which source is connected to the drain of the first N-MOS transistor, of which drain is connected to the output unit and to the gate of which the first potential is applied, and the voltage conversion circuit is arranged such that, when the pull-up circuit is so instructed as to pull up the potential of the output unit to the second potential, the potential of the pull-up control signal is brought to a potential which is not greater than the potential obtained by subtracting the threshold voltage of the first P-MOS transistor from the second potential and which is not less than the potential obtained by subtracting a voltage equivalent to the withstand voltage of the gate oxide layer of the first P-MOS transistor from the second potential, and that when the pull-up circuit is not so instructed as to pull up the potential of the output unit to the second potential, the potential of the pull-up control signal is brought to the second potential.

According to the output circuit having the arrangement above-mentioned, when supplying "H" (second potential) or "L" (grounding potential) from the output unit or when bringing the output unit to a high impedance state, a potential equivalent to the difference between the second potential and the grounding potential is not applied to the gate oxide layers of the MOS transistors forming the pull-up circuit and the pull-down circuit, such that the gate oxide layers are neither broken nor damaged.

More specifically, when supplying the second potential from the output unit, the gate potential of the first P-MOS transistor forming the pull-up circuit is not equal to 0V but becomes a potential which is not less than the voltage obtained by subtracting the withstand voltage of the gate oxide layer of the first P-MOS transistor from the second potential and which is not greater than the potential obtained by subtracting the threshold voltage of the first P-MOS transistor from the second potential. Accordingly, in the first P-MOS transistor, even though the second potential is applied to the source, the voltage across the gate and the source becomes not greater than the gate-oxide-layer withstand voltage. Further, in the first N-MOS transistor forming the pull-down circuit, the potential of the output unit or the second potential is not transmitted to the drain of the first N-MOS transistor as it is, but as dropped somewhat due to the presence of the second N-MOS transistor. This causes the voltage across the gate and the drain of the first N-MOS transistor to become not greater than the gate-oxide-layer withstand voltage.

When supplying the grounding potential from the output unit, the potential of the output unit or the grounding potential is not transmitted to the drain of the first P-MOS transistor as it is but as raised somewhat due to the presence of the second P-MOS transistor. This causes the voltage across the gate and the drain of the first P-MOS transistor to become not greater than the gate-oxide-layer withstand voltage.

Further, when bringing the output unit to a high impedance state, too, a voltage not less than the gate-oxide-layer withstand voltage is never applied to the first P-MOS transistor and the first N-MOS transistor.

Further, when the third potential is set to such a potential as to increase the drain current of a MOS transistor, the output circuit can be increased in operating speed.

According to the present invention, the voltage conversion circuit comprises: third and fourth P-MOS transistors to the sources of which the second potential is given; a fifth P-MOS transistor of which source is connected to the drain of the third P-MOS transistor; a sixth P-MOS transistor of which source is connected to the drain of the fourth P-MOS transistor: a third N-MOS transistor of which drain is connected to the drain of the sixth P-MOS transistor; a fourth N-MOS transistor of which drain is connected to the source of the third N-MOS transistor and of which source is grounded; a fifth N-MOS transistor of which drain is connected to the drain of the fifth P-MOS transistor; and a sixth N-MOS transistor of which drain is connected to the source of the fifth N-MOS transistor and of which source is grounded. The voltage conversion circuit above-mentioned is preferably arranged such that the gate of the third P-MOS transistor is connected to the drain of the fourth P-MOS transistor, the gate of the fourth P-MOS transistor is connected to the drain of the third P-MOS transistor, the third potential is applied to the gates of the fifth and sixth P-MOS transistors, the first potential is applied to the gates of the third and fifth N-MOS transistors, the first control signal generated by the signal generation circuit is entered to the gate of the sixth N-MOS transistor, an inversion signal of the first control signal is entered to the gate of the fourth N-MOS transistor, and the pull-up control signal is supplied from the node where the drain of the fourth P-MOS transistor is being connected to the source of the sixth P-MOS transistor.

According to the output circuit having the arrangement above-mentioned, when the first control signal generated by the signal generation circuit is equal to "L" (0V), the fourth P-MOS transistor is turned off and the sixth P-MOS transistor and the third and fourth N-MOS transistor are turned on. Accordingly, the pull-up control signal becomes "L". Due to the presence of the fifth P-MOS transistor, however, the potential of the pull-up control signal is equal to the sum of the third potential and the threshold voltage of a P-MOS transistor obtained with the substrate bias effect taken into consideration. Accordingly, the voltage across the gate and the source of the first P-MOS transistor forming the pull-up circuit can be made not greater than the gate-oxide-layer withstand voltage. On the other hand, when the first control signal generated by the signal generation circuit is "H", the fourth and sixth P-MOS transistors and the third N-MOS transistor are turned on and the fourth N-MOS transistor is turned off. Accordingly, the pull-up control signal becomes "H" or the second potential. By suitably setting the third potential in the course of the operations above-mentioned, provision is made such that there is not applied, to the gate oxide layer of each of the MOS transistors forming the voltage conversion circuit, a voltage not less than the withstand voltage thereof.

The output circuit according to the present invention may comprise: a potential difference detection circuit for detecting the difference between the first potential and the second potential and for supplying a potential difference detection signal indicative of whether or not the second control signal is greater than the first potential; and a switch circuit to which a predetermined potential and the grounding potential are given and to which the potential difference detection signal supplied from the potential difference detection circuit is entered, the switch circuit being arranged to selectively supply the predetermined potential when the potential difference detection signal indicates that the second potential is greater than the first potential, and to selectively supply the grounding potential when the potential difference detection signal indicates that the second potential is not greater than the first potential, and the output potential of the switch circuit may be equal to the third potential.

According to the output circuit having the arrangement above-mentioned, the potential difference detection circuit and the switch circuit are arranged such that, when the second potential is greater than the first potential, the predetermined potential is selected as the third potential, and that when the second potential is not greater than the first potential, the grounding potential is selected as the third potential. Accordingly, even though the second potential changes, there is not applied, to the gate oxide layer of each of the MOS transistors, a voltage not less than the withstand voltage thereof and there is always selected, as the third potential, such an optimum potential as to increase the drain current of a MOS transistor.

[DETAILED DESCRIPTION OF THE INVENTION]

The following description will discuss embodiments of the present invention with reference to attached drawings.

(First Embodiment)

Figure 1:
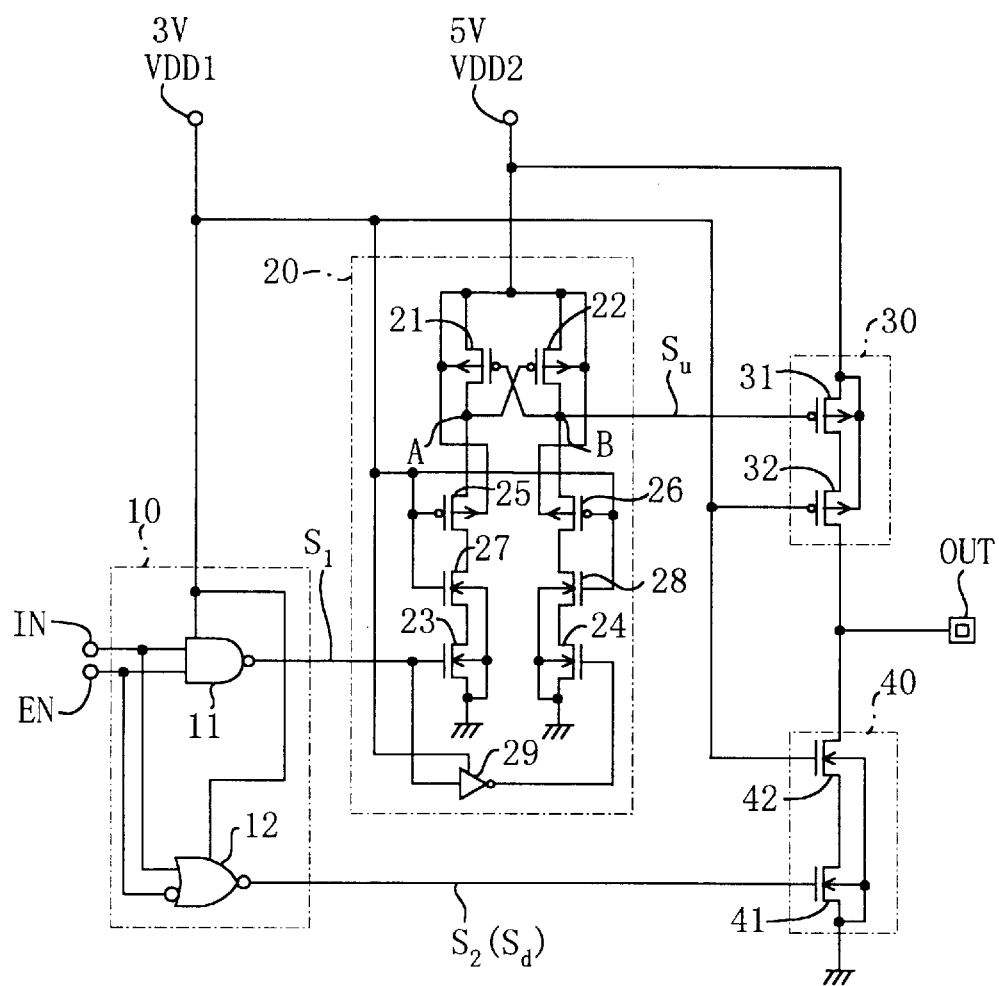
FIG. 1 is a circuit diagram illustrating the arrangement of an output circuit according to a first embodiment of the present invention.

FIG. 1 is a circuit diagram illustrating the arrangement of an output circuit according to a first embodiment of the present invention. The output circuit according to the present invention is used as an interface to be connected to an external LSI of which power voltage is not less than the withstand voltage of the gate oxide layer of each of the MOS transistors forming the LSI incorporating the output circuit. This output circuit is arranged such that, according to the output signal of an internal circuit of the last-mentioned LSI, the potential of the output pad unit of the output circuit is set to any of the power potential of the external LSI ("H" level), the grounding potential ("L" level) and a high impedance.

Shown in FIG. 1 are an output pad unit OUT serving as an output unit to be connected to a signal line of an external LSI, an input terminal IN for receiving a signal from an on-chip circuit (internal circuit of the LSI), an enable terminal EN for receiving an enable signal, these terminals IN and EN being output control terminals for controlling the potential of the output pad unit OUT, a signal generation circuit 10 for generating a first control signal $S_1$ and a second control signal $S_2$ according to the potentials of the output control terminals IN, EN, a voltage conversion circuit 20 for raising the voltage of the first control signal SI entered from the signal generation circuit 10 and for supplying the same as a pull-up control signal $S_u$, a pull-up circuit 30 for pulling up the potential of the output pad unit OUT according to the pull-up control signal $S_u$ entered from the voltage conversion circuit 20, and a pull-down circuit 40 for pulling down the potential of the output pad unit OUT according to the second control signal $S_2$ (pull-down control signal $S_d$) entered from the signal generation circuit 10. A first potential VDD1 has a value which is not greater than the withstand voltage of the gate oxide layer of each of the MOS transistors forming the LSI and which is for example 3V, and a VDD2 is a second potential which is the power potential of the external LSI and which is for example 5V.

The signal generation circuit 10 comprises a NAND gate 11 for receiving a signal entered into the input terminal IN and a NOR gate 12 for receiving an enable signal entered into the enable terminal EN. The first control signal $S_1$ is supplied from the NAND gate 11, while the second control signal $S_2$ is supplied from the NOR gate 12. The first potential VDD1 is given, as the power potential, to the NAND gate 11 and the NOR gate 12 which are operable with a voltage not greater than the withstand voltage of the gate oxide layer of each MOS transistor.

Figure 13:
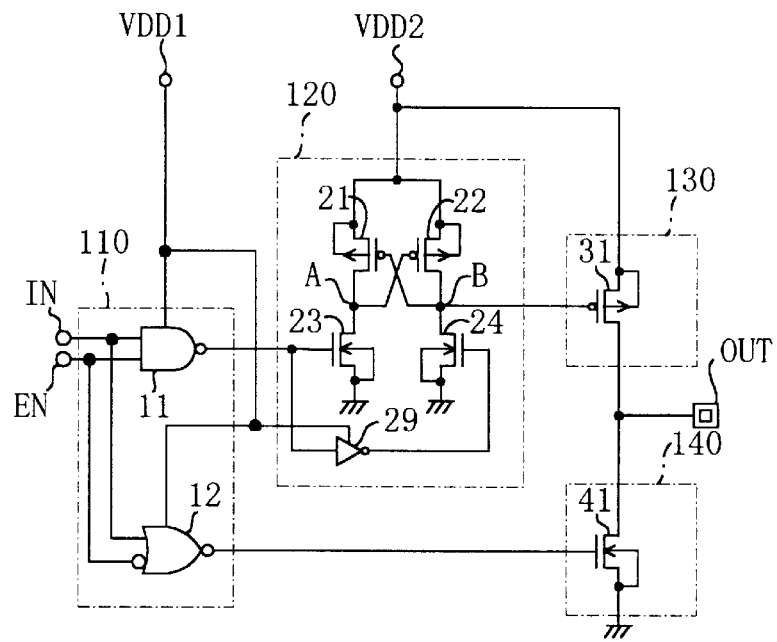
FIG. 13 is a circuit diagram illustrating the arrangement of an output circuit of prior art.
Figure 14:
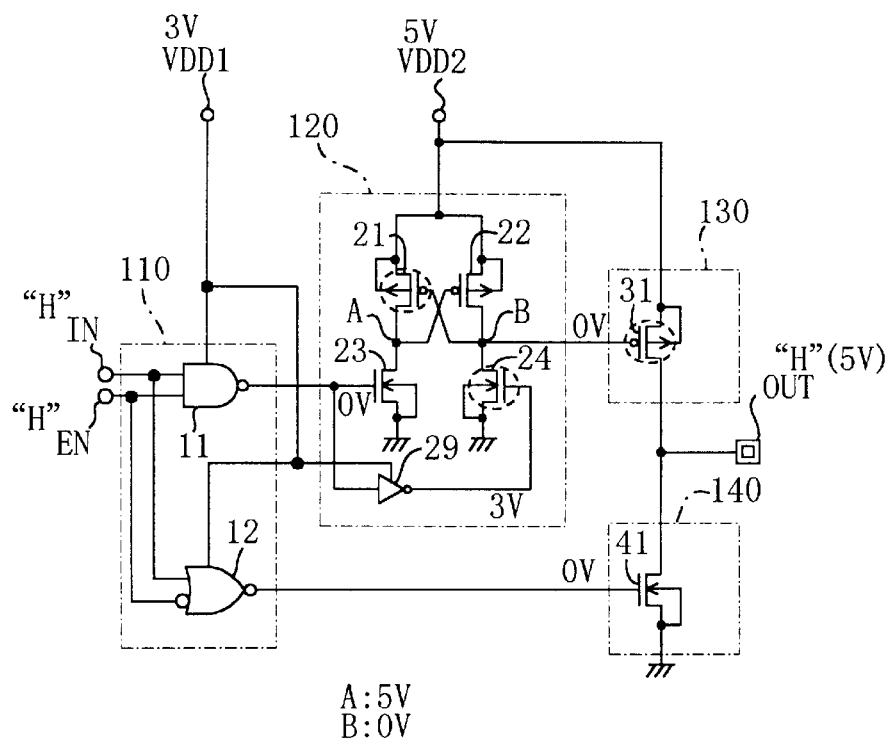
FIG. 14 is a circuit diagram of the output circuit of prior art, illustrating the operation thereof at the time when the output potential of the output pad unit OUT is high.
Figure 15:
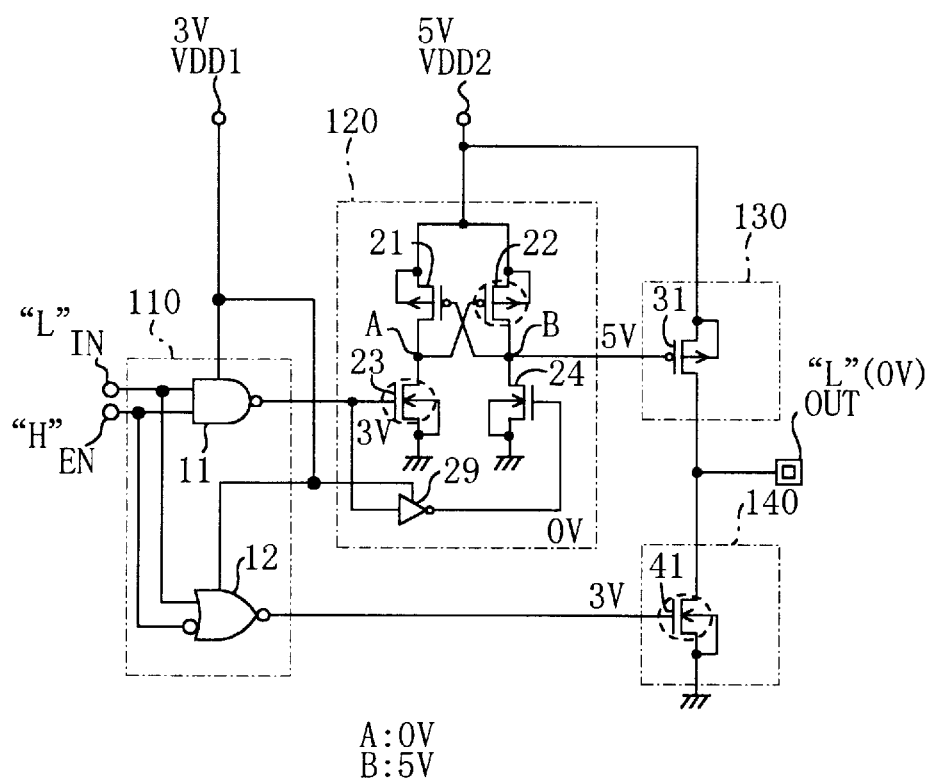
FIG. 15 is a circuit diagram of the output circuit of prior art, illustrating the operation thereof at the time when the output potential of the output pad unit OUT is low.

The voltage conversion circuit 20 comprises P-MOS transistors 21, 22, 25, 26, N-MOS transistors 23, 24, 27, 28, and an inverter circuit 29 for inverting the logic of a signal. When the voltage conversion circuit 20 is compared with the voltage conversion circuit 120 in the output circuit of prior art in FIG. 13, the P-MOS transistors 25, 26 and the N-MOS transistors 27, 28 are interposed between the P-MOS transistors 21, 22 and the N-MOS transistors 23, 24. The P-MOS transistors 21, 22, 25, 26 are respectively corresponding to third, fourth, fifth and sixth P-MOS transistors set forth in claim 3. The N-MOS transistors 23, 24, 27, 28 are respectively corresponding to sixth, fourth, fifth and third N-MOS transistors set forth in claim 3.

The second potential VDD2 is given to the sources of the P-MOS transistors 21, 22. The drain of the P-MOS transistors 21, 22 are respectively connected to the sources of the P-MOS transistors 25, 26. The drains of the P-MOS transistors 25, 26 are respectively connected to the drains of the N-MOS transistors 27, 28. The sources of the N-MOS transistors 27, 28 are respectively connected to the drains of the N-MOS transistors 23, 24. The sources of the N-MOS transistors 23, 24 are grounded.

The gate of the P-MOS transistor 21 is connected to the drain of the P-MOS transistor 22 (source of the P-MOS transistor 26) at a node B. The gate of the P-MOS transistor 22 is connected to the drain of the P-MOS transistor 21 (source of the P-MOS transistor 25) at a node A. The node B supplies a pull-up control signal $S_u$. The first potential VDD1 is applied to the gate of each of the P-MOS transistors 25, 26 and the N-MOS transistors 27, 28. The first control signal $S_1$ generated by the signal generation circuit 10 is entered into the gate of the N-MOS transistor 23. Also, the first control signal $S_1$ is entered, as inverted by the inverter circuit 29, to the gate of the N-MOS transistor 24.

The substrate potential of each of the P-MOS transistors 21, 22, 25, 26 is equal to the second potential VDD2, and the substrate potential of each of the N-MOS transistors 23, 24, 27, 28 is equal to the grounding potential. The first potential VDD1 is given, as the power potential, to the inverter circuit 29.

The pull-up circuit 30 is arranged to receive the pull-up control signal $S_u$ supplied from the voltage conversion circuit 20 and to pull up the potential of the output pad unit OUT to the second potential VDD2 when "H" is to be supplied from the output pad unit OUT. The pull-up circuit 30 comprises P-MOS transistors 31, 32. The P-MOS transistors 31, 32 are respectively corresponding to first and second P-MOS transistors set forth in claim 1.

In the P-MOS transistor 31, the pull-up control signal $S_u$ is supplied to the gate, the second potential VDD2 is given to the source and the drain is connected to the source of the P-MOS transistor 32. In the P-MOS transistor 32, the first potential VDD1 is applied to the gate, the source is connected to the drain of the P-MOS transistor 31 and the drain is connected to the output pad unit OUT. The substrate potential of each of the P-MOS transistors 31, 32 is equal to the second potential VDD2.

The pull-down circuit 40 is arranged to receive the pull-down control signal $S_d$ (second control signal $S_2$) supplied from the signal generation circuit 10 and to pull down the potential of the output pad unit OUT to the grounding potential when "L" is to be supplied from the output pad unit OUT. The pull-down circuit 40 comprises N-MOS transistors 41, 42. The N-MOS transistors 41, 42 are respectively corresponding to first and second N-MOS transistors set forth in claim 1.

In the N-MOS transistor 41, the pull-down control signal $S_d$ is entered into the gate, the source is grounded and the drain is connected to the source of the N-MOS transistor 42. In the N-MOS transistor 42, the first potential VDD3 is applied to the gate, the source is connected to the drain of the N-MOS transistor 41 and the drain is connected to the output pad unit OUT.

The following description will discuss operations of the output circuit according to the first embodiment. In the following description, it is supposed that the first potential VDD1 is equal to 3V and the second potential VDD2 is equal to 5V.

Figure 2:
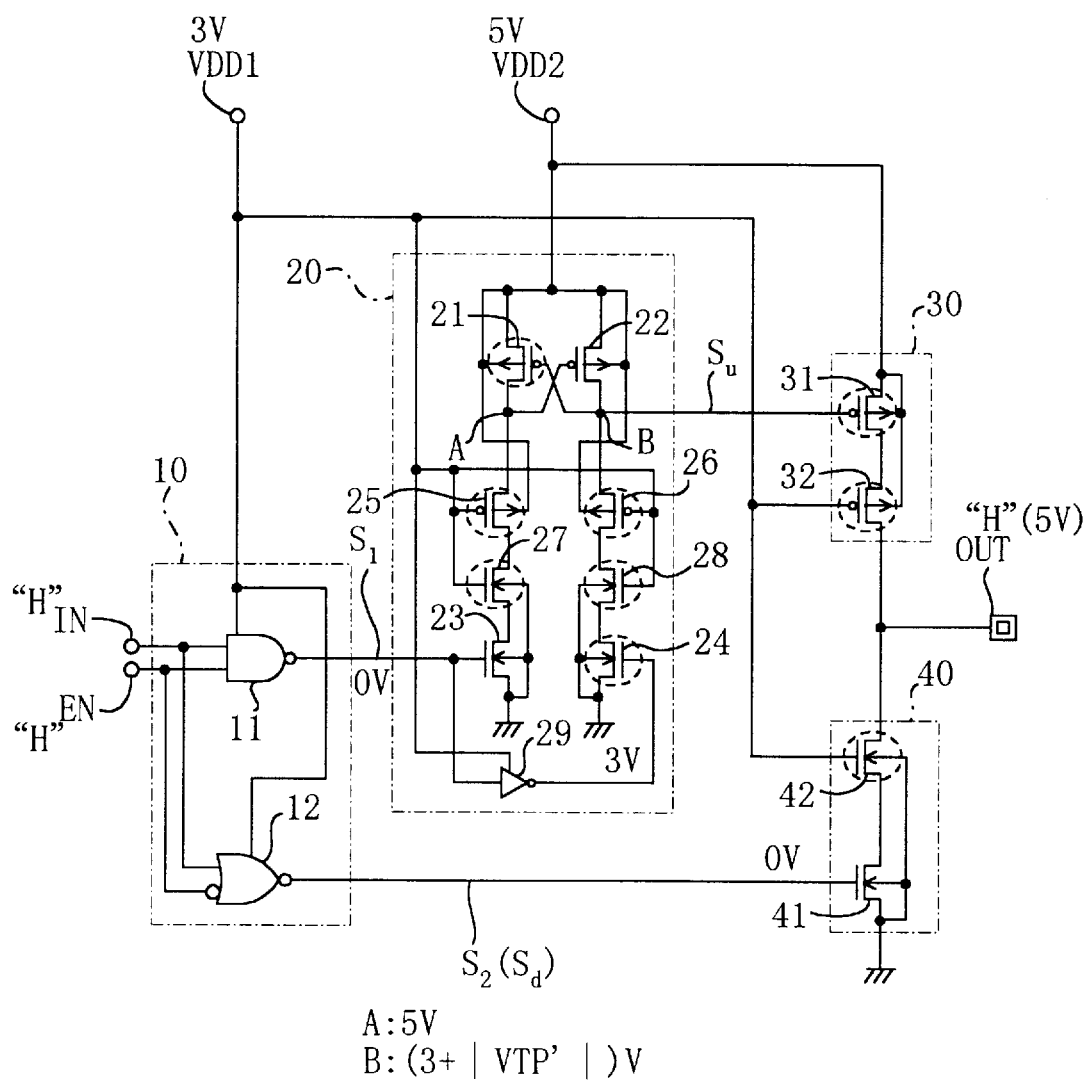
FIG. 2 is a circuit diagram of the output circuit according to the first embodiment of the present invention, illustrating the operation at the time when the output potential of the output pad unit is high.

With reference to FIG. 2, the description will first be made of the operation at the time when "H" (5V) is to be supplied from the output pad unit OUT. In this case, an enable signal of "H" (3V) is entered into the enable terminal EN and an input signal of "H" (3V) is entered into the input terminal IN.

Then, the output signal of the NAND gate 11 or the first control signal SI becomes "L" (0V) and the output signal of the NOR gate 12 or the second control signal $S_2$ also becomes "L" (0V). The gate potential of the N-MOS transistor 23 becomes 0V since the first control signal $S_1$ is equal to 0V, and the gate potential of the N-MOS transistor 24 becomes 3V since the first control signal $S_1$ is entered through the inverter circuit 29.

Accordingly, the N-MOS transistor 23 is turned off and the N-MOS transistor 24 is turned on. The N-MOS transistor 28 is turned on because the gate potential is equal to the first potential VDD1 or 3V. The P-MOS transistor 26 is turned on because the substrate potential is equal to the second potential VDD2 or 5V and the gate potential is equal to the first potential VDD1 or 3V. Accordingly, the N-MOS transistors 24, 28 and the P-MOS transistor 26 are turned on. This lowers the potential of the node B, causing the P-MOS transistor 21 to be turned on.

Since the P-MOS transistor 21 is turned on and the N-MOS transistor 23 is turned off, the potential of the node A becomes 5V. This causes the P-MOS transistor 22 to be turned off. On the other hand, since the N-MOS transistors 24, 28 and the P-MOS transistor 26 are turned on, the potential of the node B is lowered. However, the potential of the node B is not brought to 0V due to the presence of the P-MOS transistor 26. The potential VB of the node B becomes as set forth below:

$$VB=3+|VTP'|$$

wherein VTP' is the threshold voltage of a P-MOS transistor with the substrate bias effect taken into consideration.

That is, the potential of the pull-up control signal $S_u$ becomes equal to (3+V|TP'|).

When the pull-up control signal $S_u$ is lowered in potential, the P-MOS transistor 31 of the pull-up circuit 30 is turned on. The P-MOS transistor 32 is turned on since the substrate potential is equal to the second potential VDD2 or 5V and the gate potential is equal to the first potential VDD1 or 3V. The N-MOS transistor 41 of the pull-down circuit 40 is turned off since the pull-down control signal $S_d$ (second control signal $S_2$) supplied from the signal generation circuit 10 is equal to 0V and the gate potential therefore becomes 0V. Thus, the P-MOS transistor 31 is turned on, the N-MOS transistor 41 is turned off and the second potential VDD2 or 5V is given to the source of the P-MOS transistor 31. Accordingly, the potential of the output pad unit OUT becomes "H" (5V).

As discussed in the foregoing, when the enable signal of "H" (3V) is entered into the enable terminal EN and the input signal of "H" (3V) is entered into the input terminal IN, the output pad unit OUT supplies "H" (5V). In FIG. 2, there is surrounded, by a circle in a broken line, each MOS transistor which is turned on when "H" (5V) is supplied from the output pad unit OUT.

At this time, a voltage of 5V is not applied to the gate oxide layer of any of the MOS transistors forming the output circuit.

More specifically, when "H" (5V) is supplied from the output pad unit OUT, the gate potential of the N-MOS transistor 23 becomes 0V and the potential of the node A becomes 5V. However, due to the presence of the N-MOS transistor 27 having the gate to which the first potential VDD1 or 3V is given, the drain potential VD23 of the N-MOS transistor 23 does not become 5V, but becomes as follows:

$$VD23=3-VTN'$$

wherein VTN' is the threshold voltage of an N-MOS transistor with the substrate bias effect taken into consideration.

Accordingly, the voltage across the gate and the drain of the N-MOS transistor 23 is equal to (3−VTN')V which does not becomes 5V but is not greater than 3V.

Further, the potential of the node B becomes 5V and the potential of the node A becomes (3+|VTP'|)V. Accordingly, the absolute values of the voltage across the gate and the drain (VDG22) of the P-MOS transistor 22, the voltage across the gate and the source (VGS21) of the P-MOS transistor 21 and the voltage across the gate and the source (VGS31) of the P-MOS transistor 31 do not become 5V but are not greater than 3V as shown below:

$$
\begin{aligned}
|VDG22| &= |VGS\,21| \\
&= |VGS\,31| \\
&= |(3+|VTP'|)-5| \\
&= 2-|VTP'|
\end{aligned}
$$

Further, the gate potential of the N-MOS transistor 41 becomes 0V and the potential of the output pad unit OUT becomes 5V. However, due to the presence of the N-MOS transistor 42 having the gate to which the first potential VDD1 or 3V is given, the voltage (VD41) applied to the drain of the N-MOS transistor 41 does not become 5V but becomes as follows:

$$VD41=3-VTN'$$

Accordingly, in the N-MOS transistor 41, too, the voltage across the gate and the drain is equal to (3−VTN') which does not become 5V but is not greater than 3V.

Figure 3:
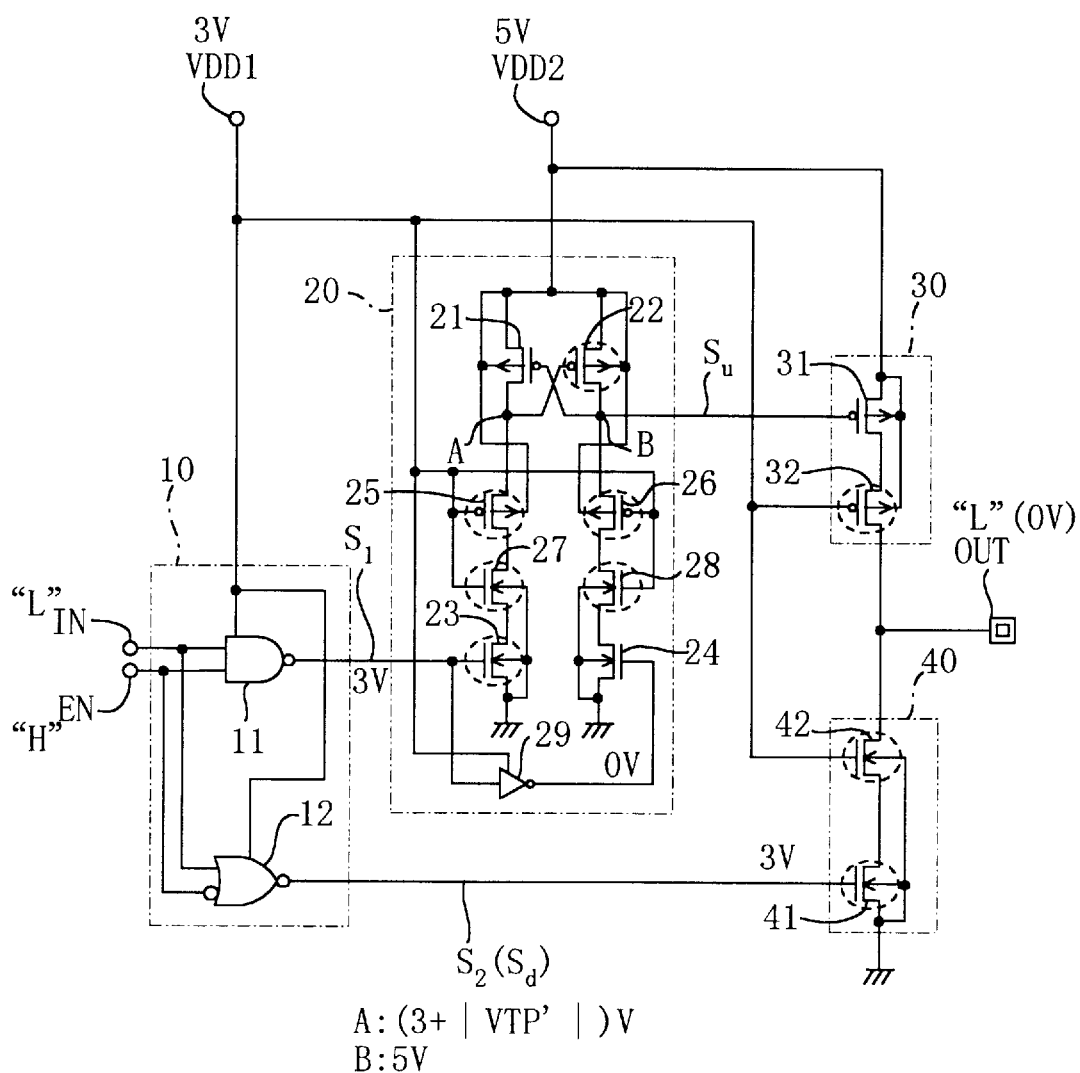
FIG. 3 is a circuit diagram of the output circuit according to the first embodiment of the present invention, illustrating the operation at the time when the output potential of the output pad unit is low.

With reference to FIG. 3, the description will then be made of the operation at the time when "L" (0V) is to be supplied from the output pad unit OUT. In this case, an enable signal of "H" (3V) is entered into the enable terminal EN and an input signal of "L" (0V) is entered into the input terminal IN.

Then, the output signal of the NAND gate 11 or the first control signal $S_1$ becomes "H" (3V) and the output signal of the NOR gate 12 or the second control signal $S_2$ also becomes "H" (3V). When the first control signal $S_1$ becomes 3V, the gate potential of the N-MOS transistor 23 becomes 3V. The gate potential of the N-MOS transistor 24 becomes 0V since the first control signal $S_1$ is entered through the inverter circuit 29.

Accordingly, the N-MOS transistor 23 is turned on and the N-MOS transistor 24 is turned off. The N-MOS transistor 27 is turned on since the gate potential is equal to the first potential VDD1 or 3V. The P-MOS transistor 25 is turned on since the substrate potential is equal to the second potential VDD2 or 5V and the gate potential is equal to the first potential VDD1 or 3V. Accordingly, the N-MOS transistors 23, 27 and the P-MOS transistor 25 are turned on. This lowers the potential of the node A, causing the P-MOS transistor 22 to be turned on. Since the P-MOS transistor 22 is turned on but the N-MOS transistor 24 is turned off, the potential of the node B becomes 5V. That is, the potential of the pull-up control signal $S_u$ becomes 5V.

Since the potential of the node B becomes 5V, the P-MOS transistor 21 is turned off. On the other hand, since the N-MOS transistors 23, 27 and the P-MOS transistor 25 are turned on, the potential of the node A is lowered but does not become 0V due to the presence of the P-MOS transistor 25. The potential VA of the node A at this time becomes as follows:

$$VA=3+|VTP'|$$

wherein VTP' is the threshold voltage of a P-MOS transistor with the substrate bias effect taken into consideration.

The potential of the pull-up control signal $S_u$ becomes 5V. Accordingly, the P-MOS transistor 31 of the pull-up circuit 30 is turned off. Since the potential of the pull-down control signal $S_d$ (second control signal $S_2$) is 3V, the gate potential of the N-MOS transistor 41 of the pull-down circuit 40 becomes 3V. Thus, the P-MOS transistor 31 is turned off, the N-MOS transistor 41 is turned on and the source of the N-MOS transistor 41 is grounded. Accordingly, the potential of the output pad unit OUT becomes "L" (0V).

Thus, when the enable signal of "H" (3V) is entered into the enable terminal EN and the input signal of "L" (0V) is entered into the input terminal IN, the output pad unit OUT supplies "L" (0V). In FIG. 3, there is surrounded, by a circle in a broken line, each of the MOS transistors which are turned on when "L" (0V) is supplied from the output pad unit OUT.

Further, a voltage of 5V is not applied to the gate oxide layer of any of the MOS transistors forming the output circuit, thus preventing the gate oxide layer from being broken or deteriorated.

More specifically, when the output pad unit OUT supplies "L" (0V), the gate potential of the N-MOS transistor 24 becomes 0V and the potential of the node B becomes 5V. However, due to the presence of the N-MOS transistor 28 having the gate to which the first potential VDD1 or 3V is applied, the voltage (VD24) applied to the drain of the N-MOS transistor 24 does not becomes 5V, but becomes as follows:

$$VD24=3-VTN'$$

wherein VTN' is the threshold voltage of an N-MOS transistor with the substrate bias effect taken into consideration.

Accordingly, the voltage across the gate and the drain of the N-MOS transistor 24 is equal to (3−VTN')V which does not becomes 5V but is not greater than 3V.

Further, the potential of the node A becomes 5V and the potential of the node B becomes (3+|VTP'|). Accordingly, the absolute values of the voltage across the gate and the drain (VDG22) of the P-MOS transistor 22 and the voltage across the gate and the source (VGS21) of the P-MOS transistor 21 do not become 5V but are not greater than 3V as shown below:

$$|VDG22| = |VGS\,21|$$
$$= |(3 + |VTP'|) - 5|$$
$$= 2 - |VTP'|$$

Further, the gate potential of the P-MOS transistor 31 becomes 5V and the potential of the output pad unit OUT becomes 0V. However, due to the presence of the P-MOS transistor 32 having the gate to which the first potential VDD1 has been applied, the drain voltage VD31 of the P-MOS transistor 31 becomes as follows:

$$VD31=3+|VTP'|$$

Accordingly, the absolute value of the voltage across the gate and the source (VGS31) of the P-MOS transistor 31 does not become 5V but is not greater than 3V as shown below:

$$|VDG31|=|(3+|VTP'|)-5|=2-|VTP'|$$

The following description will discuss the operation when the output pad unit OUT is to be brought to a high impedance state. First, an enable signal of "L" (0V) is entered into the enable terminal EN.

Then, the output signal of the NAND gate 11 or the first control signal S₁ becomes "H" (3V) and the output signal of the NOR gate 12 or the second control signal S₂ becomes "L" (0V). In this case, the voltage conversion circuit 20 conducts an operation similar to that at the time when "H" is to be supplied from the output pad unit OUT. Accordingly, the potential of the node A becomes (3+|VTP'|) and the potential of the node B or the pull-up control signal S_u becomes 5V. Accordingly, the P-MOS transistor 31 of the pull-up circuit 30 is turned off since the gate potential becomes 5V, and the N-MOS transistor 41 of the pull-down circuit 40 is also turned off since the gate potential becomes 0V. Thus, the output pad unit OUT is brought to a high impedance state.

Even though 5V or 0V is externally applied to the output pad unit OUT, a voltage of 5V is not applied to the gate oxide layer of any of the MOS transistors forming the output circuit, thus preventing the gate oxide layer from being broken or deteriorated, likewise in the case that "H" or "L" is supplied from the output pad unit OUT.

As discussed in the foregoing, the output circuit according to the first embodiment can supply a signal of which amplitude is equal to 5V without a voltage of 5V applied to the gate oxide layer of each of all the MOS transistors. More specifically, according to the output circuit of the first embodiment, even though the power voltage of an external LSI is not less than the withstand voltage of the gate oxide layer of each of the MOS transistors forming the output circuit, there can be supplied a signal of which amplitude is equal to the power voltage of the external LSI without a voltage not less than the withstand voltage of the gate oxide layer of each MOS transistor applied.

Figure 4:
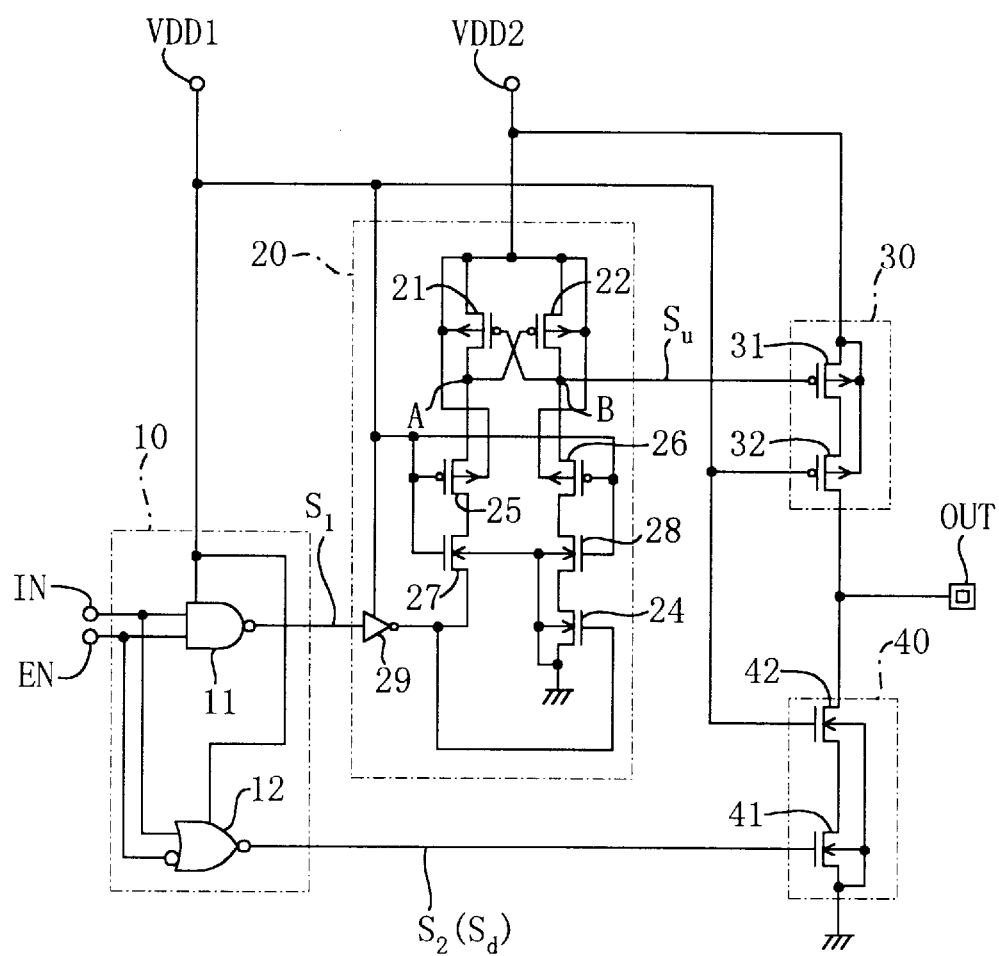
FIG. 4 is a circuit diagram illustrating the arrangement of a modification of the output circuit according to the first embodiment of the present invention.

The output circuit according to the first embodiment may be arranged as shown in FIG. 4. In FIG. 4, a voltage conversion circuit 20 has an arrangement in which the N-MOS transistor 23 is being removed from the voltage conversion circuit 20 of the output circuit shown in FIG. 1 and in which the output line of an inverter circuit 29 is connected directly to the source of an N-MOS transistor 27. The output circuit shown in FIG. 4 produces effects similar to those produced by the output circuit in FIG. 1 with the number of the N-MOS transistors reduced by one.

(Second Embodiment)

Figure 5:
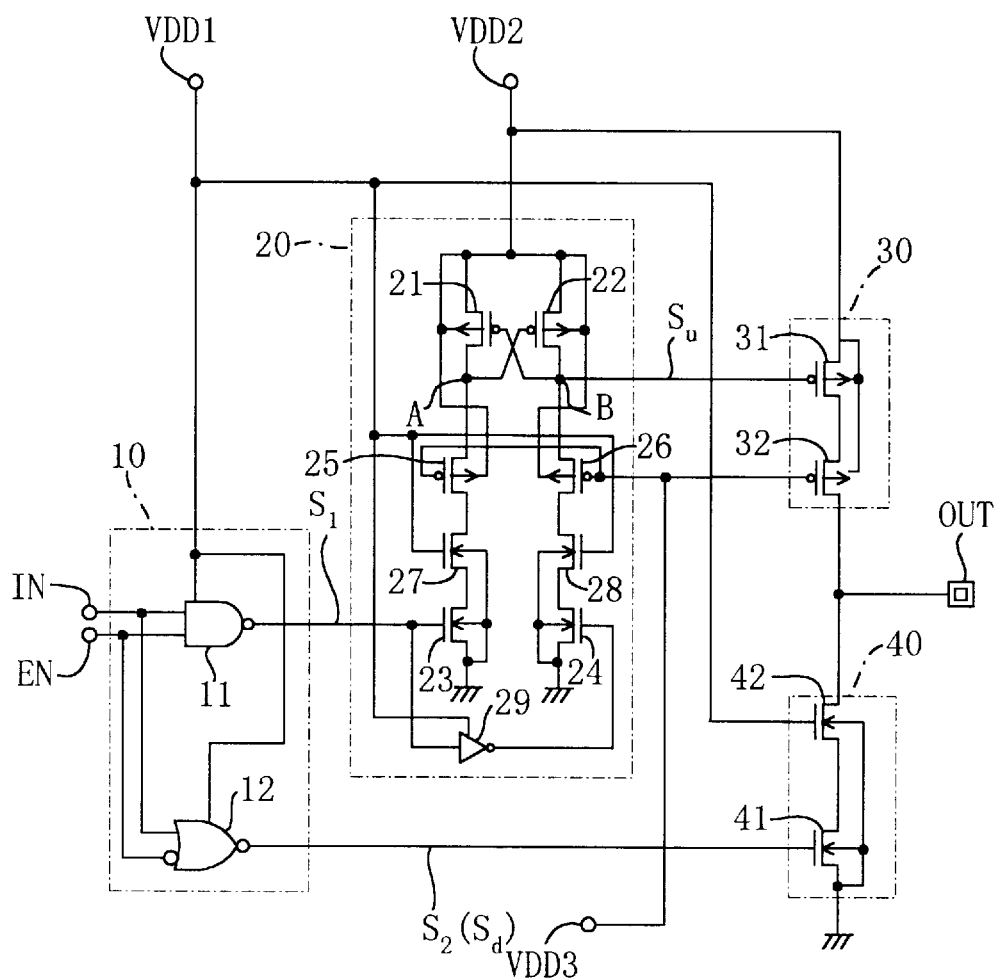
FIG. 5 is a circuit diagram illustrating the arrangement of an output circuit according to a second embodiment of the present invention.

FIG. 5 is a circuit diagram illustrating the arrangement of an output circuit according to a second embodiment of the present invention. This output circuit in FIG. 5 is different from the output circuit according to the first embodiment in FIG. 1 in that, instead of the first potential VDD1, a third potential VDD3 is applied to the gates of P-MOS transistors 25, 26 forming a voltage conversion circuit 20 and to the gate of a P-MOS transistor 32 forming a pull-up circuit 30.

In FIG. 5, like parts are designated by like reference numerals used in FIG. 1, and the detailed description thereof will be here omitted.

The output circuit in FIG. 5 is operated in a manner similar to that in which the output circuit according to the first embodiment in FIG. 1 is operated. Also, the MOS transistors are turned on or off in manners similar to those in the output circuit in FIG. 1 when "H" (5V) or "L" (0V) is to be supplied from the output pad unit OUT and when the output pad unit OUT is to be brought to a high impedance state.

However, since the output circuit in FIG. 5 is arranged to apply the third potential VDD3 to the gates of the P-MOS transistors 25, 26, 32, the gate potentials of these P-MOS transistors can optionally be set.

It is now supposed that the first potential VDD1 is equal to 3V and that the second potential VDD2 is equal to 5V. As in the output circuit shown in FIG. 1, when the first potential VDD1 is applied to the gates of the P-MOS transistors 25, 26, 32, the voltage across the gate and the source VGS of each of the P-MOS transistors 25, 26, 32 becomes as follows:

$$VGS = VDD1 - VDD2$$
$$= 3 - 5$$
$$= -2$$

The drain current $I_{dsp}$ of a P-MOS transistor when the voltage thereof is saturated, is expressed by the following equation:

$$I_{dsp} = \frac{\beta_p}{2} \times (VGS - VTP)^2$$

wherein $\beta_p$ is the gain coefficient of the transistor and VTP is the threshold voltage when the substrate bias is equal to 0V.

More specifically, as the voltage across the gate and the source VGS is increased within the range allowable in the LSI production process, the drain current of a P-MOS transistor can be increased. It is now supposed that the maximum value of the voltage across the gate and the source allowable in the LSI production process is equal to 3.6V for example. When 1.4V is applied as the third potential VDD3 in the output circuit in FIG. 5, the voltage across the gate and the source VGS' of each of the P-MOS transistors 25, 26, 32 becomes the maximum value allowable in the range in the LSI production process as follows:

$$VGS'=VIN-VDD2=1.4-5=-3.6$$

When VTP is now supposed to be −0.6V, the ratio of the drain current of a P-MOS transistor in the output circuit in FIG. 5 to the drain current of a P-MOS transistor in the output circuit shown in FIG. 1, becomes as follows:

$$\frac{(-3.6-(-0.6))^2}{(-2-(-0.6))^2} = \frac{9}{1.96} = 4.59$$

Accordingly, the drain current of a P-MOS transistor in the output circuit in FIG. 5 can be increased by 4.59 times the drain current in the output circuit shown in FIG. 1. This produces the effect of increasing the operating speed of the output circuit in proportion to an increase in drain current. The third potential VDD3 may be applied from the outside of the LSI incorporating the output circuit, or there may be disposed, inside of the LSI, a voltage generation circuit for generating the third potential VDD3.

Likewise in the modification according to the first embodiment shown in FIG. 4, the voltage conversion circuit may be arranged such that the N-MOS transistor 23 is removed and that the output line of the inverter circuit 29 is connected directly to the source of the N-MOS transistor 27.

(Third Embodiment)

Figure 6:
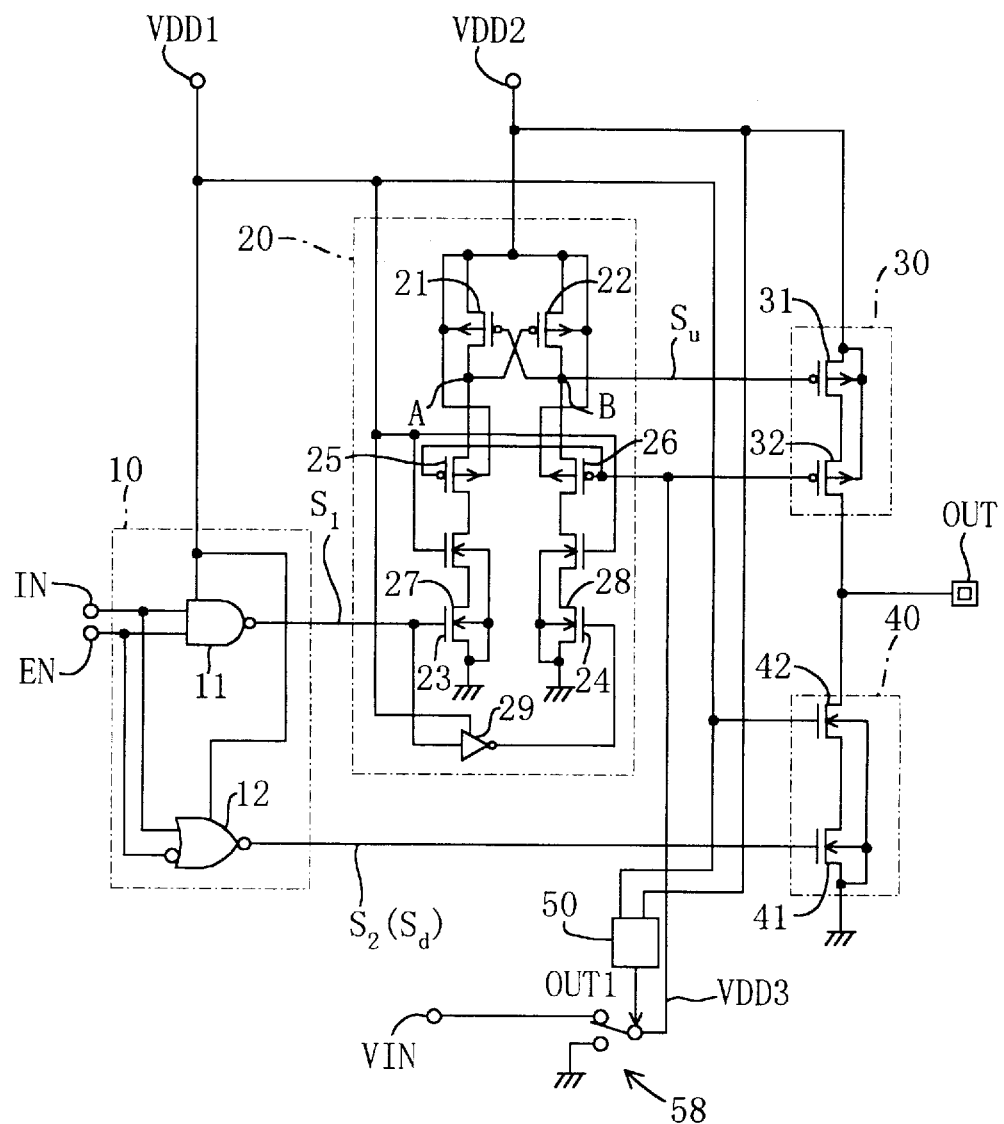
FIG. 6 is a circuit diagram illustrating the arrangement of an output circuit according to a third embodiment of the present invention.

FIG. 6 is a circuit diagram illustrating the arrangement of an output circuit according to a third embodiment of the present invention. The output circuit in FIG. 6 is different from the output circuit according to the second embodiment in FIG. 5 in the following point.

The third potential VDD3 to be applied to the gates of the P-MOS transistors 25, 26 of the voltage conversion circuit 20 and to the gate of the P-MOS transistor 32 of the pull-up circuit 30, is set, according to a potential difference detection signal OUT1 supplied by a potential difference detection circuit 50 for detecting the difference between the first potential VDD1 and the second potential VDD2, to a predetermined potential VIN or a grounding potential by a switch circuit 58.

In FIG. 6, like parts are designated by like reference numerals used in FIG. 5, and the detailed description thereof will be here omitted.

The output circuit in FIG. 6 is operated in a manner similar to that in which each of the output circuits according to the first and second embodiments in FIGS. 1 and 5. Also, the MOS transistors are turned on or off in manners similar to those in each of the output circuits in FIGS. 1 and 5 when "H" (5V) or "L" (0V) is to be supplied from the output pad unit OUT and when the output pad unit OUT is to be brought to a high impedance state.

According to the potential difference detection signal OUT1 supplied from the potential difference detection circuit 50, the switch circuit 58 (i) applies the predetermined potential VIN to the gate of each of the P-MOS transistors 25, 26, 32 when the second potential VDD2 is higher than the first potential VDD1, and (ii) causes the gates of the P-MOS transistors 25, 26, 32 to be grounded when the second potential VDD2 is not greater than the first potential VDD1.

The following description will discuss the object of the arrangement in FIG. 6.

It is now supposed that the first potential VDD1 is equal to 3V. When the output circuit according to the present invention is always connected to another LSI operable with a 5V power source (that is, the second potential VDD2 is always 5V), no particular problem arises from each of the arrangements in FIGS. 1 and 5. However, there are instances where the user uses the output circuit according to the present invention as connected to another LSI operable with a 3V power source. In such a case where each of the first potential VDD1 and the second potential VDD2 is equal to 3V, when an output circuit having the arrangement shown in FIG. 1 or 5 is used, the drain current flowing in each MOS transistor is remarkably lowered to lower the operating speed.

For example, when the first potential VDD1 is equal to 3V and the third potential VDD3 is equal to 1.4V in the output circuit shown in FIG. 5, the voltage across the gate and the source VGS of each of the P-MOS transistors 25, 26, 32 is equal to −3.6V when the second potential VDD2 is equal to 5V as discussed in connection with the second embodiment. However, when the second potential VDD2 is equal to 3V, the voltage across the gate and the source VGS of each of the P-MOS transistors 25, 26, 32 becomes as follows:

$$VGS=VDD3-VDD2=1.4-3=-1.6$$

The ratio of the drain current of each of the P-MOS transistors 25, 26, 32 when the second potential VDD2 is 5V to the drain current of each of the P-MOS transistors 25, 26, 32 when the second potential VDD2 is 3V, becomes as follows:

$$\frac{(-1.6-(-0.6))^2}{(-3.6-(-0.6))^2} = \frac{1}{9} = 0.11$$

Accordingly, when the second potential VDD2 becomes 3V, the drain current is reduced to 0.11 time the drain current obtained when the second potential VDD2 is 5V.

On the other hand, according to the output circuit of the third embodiment in FIG. 6, when the second potential VDD2 is not greater than the first potential VDD1, the switch circuit 58 causes the gates of the P-MOS transistors 25, 26, 32 to be grounded. Accordingly, even though the second potential VDD2 is equal to, for example, 3V which is equal to the first potential VDD1, the voltage across the gate and the source VGS of each of the P-MOS transistors 25, 26, 32 becomes as follows:

$$VGS=VDD3-VDD2=0-3=-3$$

The ratio of the drain current of each of the P-MOS transistors 25, 26, 32 with the second potential VDD2 of 5V to the drain current of each of the P-MOS transistors 25, 26, 32 with the second potential VDD2 of 3V, becomes as follows:

$$\frac{((-3.0-(-0.6))^2}{(-3.6-(-0.6))^2} = \frac{5.76}{9} = 0.64$$

Accordingly, although the drain current in the output circuit shown in FIG. 5 is reduced to 0.11 time the drain current obtained when the second potential VDD2 is 5V, the drain current in the output circuit according to the third embodiment shown in FIG. 6 is reduced only by 0.64 time. This considerably restrains the lowering of the operating speed due to change in second potential VDD2.

Figure 7:
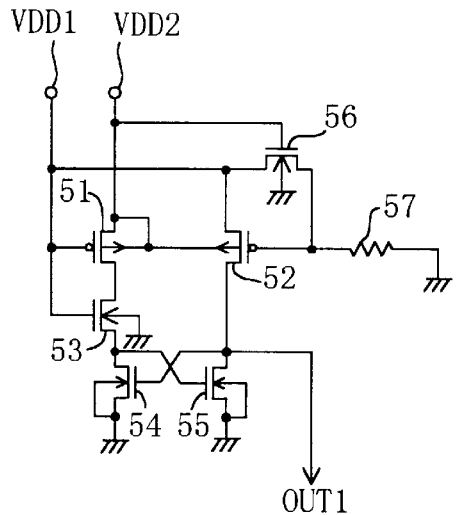
FIG. 7 is a circuit diagram illustrating in detail the arrangement of the potential difference detection circuit in the output circuit according to the third embodiment of the present invention.

FIG. 7 is a circuit diagram illustrating in detail the arrangement of the potential difference detection circuit 50.

In FIG. 7, P-MOS transistors 51, 52 are respectively corresponding to seventh and eighth P-MOS transistors set forth in claim 11. Also, N-MOS transistors 53, 54, 55, 56 are respectively corresponding to seventh, eighth, ninth and tenth N-MOS transistors set forth in claim 11. There is also shown a high resistance 57.

In the P-MOS transistor 51, the first potential VDD1 is applied to the gate, the second potential VDD2 is given to the source and the substrate, and the drain is connected to the drain of the N-MOS transistor 53. In the P-MOS transistor 52, the gate is connected to the source of the N-MOS transistor 56, the second potential VDD2 is given to the substrate, the first potential VDD1 is given to the source which is connected to the drain of the N-MOS transistor 56, and the drain is connected to the drain of the N-MOS transistor 55 and to the gate of the N-MOS transistor 54. The potential difference detection signal OUT1 is supplied from the connection point of the drain of the P-MOS transistor 52.

In the N-MOS transistor 53, the first potential VDD1 is applied to the gate, the drain is connected to the drain of the P-MOS transistor 51, the source is connected to the drain of the N-MOS transistor 54 and to the gate of the N-MOS transistor 55, and the substrate is grounded. In the N-MOS transistor 54, the gate is connected to the drain of the P-MOS transistor 52 and to the drain of the N-MOS transistor 55, the drain is connected to the source of the N-MOS transistor 53 and to the gate of the N-MOS transistor 55, and the substrate and the source are grounded. In the N-MOS transistor 55, the gate is connected to the source of the N-MOS transistor 53 and to the drain of the N-MOS transistor 54, the drain is connected to the drain of the P-MOS transistor 52 and to the gate of the N-MOS transistor 54, and the substrate and the source are grounded.

In the N-MOS transistor 56, the second potential VDD2 is applied to the gate, the first potential VDD1 is given to the drain, the source is connected to the gate of the P-MOS transistor 52, and the substrate is grounded. The high resistance 57 has one end connected to the source of the N-MOS transistor 56 and to the gate of the P-MOS transistor 52, and the other end which is grounded.

Figure 8:
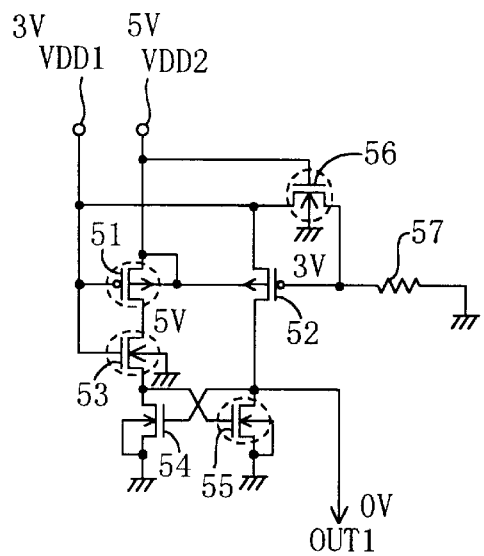
FIG. 8 is a detailed circuit diagram of the potential difference detection circuit in the output circuit according to the third embodiment of the present invention, illustrating the operation at the time when a second potential is greater than a first potential.
Figure 9:
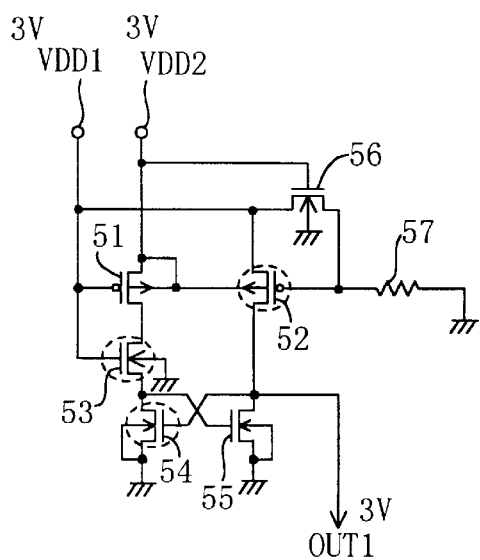
FIG. 9 is a detailed circuit diagram of the potential difference detection circuit in the output circuit according to the third embodiment of the present invention, illustrating the operation at the time when the second potential is not greater than the first potential.

With reference to FIGS. 8 and 9, the following description will discuss the operation of the potential difference detection circuit 50 shown in FIG. 7.

First, the description will be made of the operation when the second potential VDD2 is higher than the first potential VDD1, for example when the second potential VDD2 is equal to 5V and the first potential VDD1 is equal to 3V.

The P-MOS transistor 51 is turned on since the gate potential is equal to the first potential VDD1 or 3V and the potential of each of the source and the substrate is equal to the second potential VDD2 or 5V. On the other hand, the N-MOS transistor 56 is turned on since the substrate potential is equal to 0V, the drain potential is equal to the first potential VDD1 or 3V and the gate potential is equal to the second potential VDD2 or 5V. In the N-MOS transistor 56, the source potential becomes 3V. The P-MOS transistor 52 is turned off since the source potential is equal to the first potential VDD1 or 3V, the substrate potential is equal to the second potential VDD2 or 5V, and the gate potential is equal to the source potential of the N-MOS transistor 56 or 3V. The N-MOS transistor 53 is turned on since the gate potential is equal to the first potential VDD1 or 3V.

Since the P-MOS transistor 51 and the N-MOS transistor 53 are turned on, the N-MOS transistor 55 is increased in gate potential and then turned on. When the N-MOS transistor 55 is turned on, the gate potential of the N-MOS transistor 54 becomes the grounding potential, causing the N-MOS transistor 54 to be turned off.

Accordingly, when the second potential VDD2 is higher than the first potential VDD1 as shown in FIG. 8, (i) the P-MOS transistor 51 and the N-MOS transistors 53, 55, 56 are turned on, (ii) the P-MOS transistor 52 and the N-MOS transistor 54 are turned off, and (iii) the potential difference detection signal OUT1 becomes the grounding potential or 0V. In FIG. 8, there is surrounded, by a circle in a broken line, each MOS transistor which is turned on when the second potential VDD2 is higher than the first potential VDD1.

The description will then be made of the operation when the second potential VDD2 is not greater than the first potential VDD1, for example when each of the first and second potentials VDD1, VDD2 is equal to 3V.

The P-MOS transistor 51 is turned off since all the potentials of the gate, source and substrate are equal to 3V. On the other hand, the N-MOS transistor 56 exhibits a source-follower operation since the substrate is equal to 0V and each of the gate and drain potentials is equal to 3V. The source potential VS becomes as follows:

$VS=VDD2-VTN'=3-0.9=2.1$ wherein VTN' is the threshold voltage with the substrate bias effect taken into consideration and is now supposed to be 0.9V.

Accordingly, the P-MOS transistor 52 is turned on since the gate potential becomes 2.1V and the potentials of the source and substrate are equal to 3V. When the P-MOS transistor 52 is turned on, the N-MOS transistor 54 is increased in gate potential and then turned on. When the N-MOS transistor 54 is turned on, the gate potential of the N-MOS transistor 55 becomes the grounding potential and the N-MOS transistor 55 is turned off.

Accordingly, when the second potential VDD2 is equal to the first potential VDD1 as shown in FIG. 9, the P-MOS transistor 52 and the N-MOS transistors 53, 54 are turned on, and the P-MOS transistor 51 and the N-MOS transistor 55 are turned off. Thus, the potential difference dection signal OUT1 becomes 3V. In FIG. 9, there is surrounded, by a circle in a broken line, each MOS transistor which is turned on when the second potential VDD2 is equal to the first potential VDD1. The N-MOS transistor 56 is weakly turned on.

Further, the potential difference detection circuit 50 in FIG. 7 is arranged such that, even though the second potential VDD2 is higher than the first potential VDD1, a voltage equivalent to or more than the difference between the first potential VDD1 and the grounding potential is not applied to the gate oxide layer of each MOS transistor.

For example, when the first potential VDD1 is equal to 3V and the second potential VDD2 is equal to 5V, the N-MOS transistor 56 is turned on even though (i) the substrate potential is equal to 0V, (ii) the source and drain potentials are equal to 3V and (iii) the gate potential is equal to 5V. Further, an inversion layer (3V in this example) is generated on the substrate. Thus, the voltage applied to the gate oxide layer is equal to 2V. In the P-MOS transistor 51, the potential of each of the substrate, the source and the drain becomes 5V but the gate potential is equal to 3V. Therefore, the voltage applied to the gate oxide layer is equal to 2V. In the N-MOS transistor 53, the drain potential is equal to 5V and the substrate potential is equal to 0V, but the gate potential is equal to 3V. Therefore, the N-MOS transistor 53 is turned on. Further, an inversion layer is generated on the substrate thereof. Thus, the voltage applied to the gate oxide layer is not greater than 2V.

In the potential difference detection circuit 50, "L" is supplied as the potential difference detection signal OUT1 when the second potential VDD2 is higher than the first potential VDD1, and "H" is supplied as the potential difference detection signal OUT1 when the second potential VDD2 is equal to the first potential VDD1. Further, there is not applied, to the gate oxide layer of each transistor, a voltage equivalent to or more than the difference between the first potential VDD1 and the grounding potential.

According to the potential difference detection signal OUT1 of the potential difference detection circuit 50, the switch circuit 58 applies, as the third potential VDD3, the predetermined potential VIN to the gate of each of the P-MOS transistors 25, 26, 32 when the second potential VDD2 is higher than the first potential VDD1, and causes the gate of each of the P-MOS transistors 25, 26, 32 to be grounded when the second potential VDD2 is not greater than the first potential VDD1. The arrangement abovementioned enables the output circuit to be operated at high speed even though the second potential VDD2 is lowered. Thus, there can be provided an output circuit which can always be operated at high speed regardless of the type of an external LSI to be operable with 3V or 5V, and which has a wide range of operable voltage.

(Fourth Embodiment)

Figure 10:
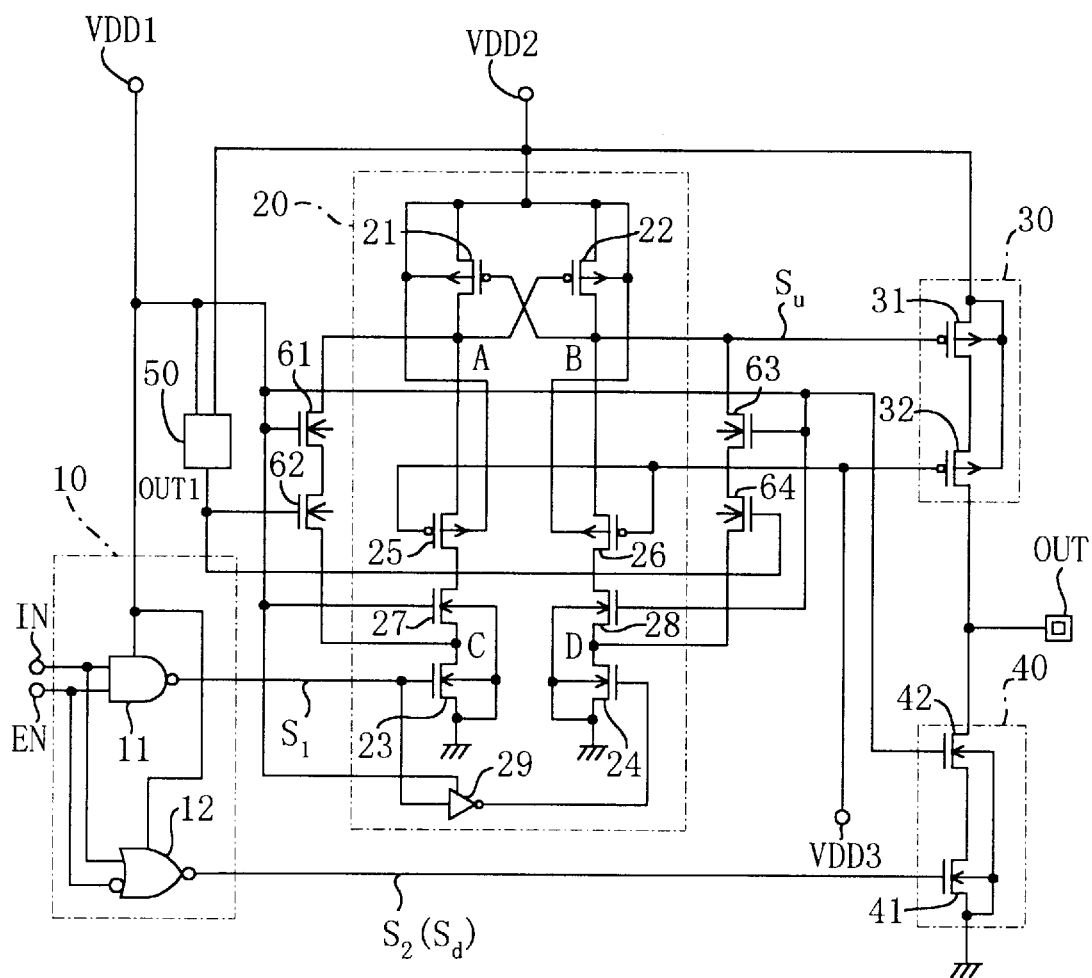
FIG. 10 is a circuit diagram illustrating the arrangement of an output circuit according to a fourth embodiment of the present invention.

FIG. 10 is a circuit diagram illustrating the arrangement of an output circuit according to a fourth embodiment of the present invention. In the output circuit in FIG. 10, N-MOS transistors 61, 62 are connected in series between a node A and a node C where the drain of an N-MOS transistor 23 is connected to the source of an N-MOS transistor 27, and N-MOS transistors 63, 64 are connected in series between a node B and a node D where the drain of an N-MOS transistor 24 is connected to the source of an N-MOS transistor 28. A first potential VDD1 is applied to the gates of the N-MOS transistors 61, 63, and a potential difference detection circuit 50 for detecting the difference between the first and second potentials VDD1, VDD2 supplies a potential difference detection signal OUT1 to the gates of the N-MOS transistors 62, 64.

Except for the foregoing, the output circuit in FIG. 10 is similar in arrangement to the output circuit according to the second embodiment in FIG. 5. In FIG. 10, like parts are designated by like reference numerals used in FIG. 5 and the detailed description thereof will be omitted. The N-MOS transistors 61, 62, 63, 64 form a voltage conversion acceleration circuit and are respectively corresponding to eleventh, twelfth, thirteenth and fourteenth N-MOS transistors set forth in claim 14.

It is an object of the output circuit according to the fourth embodiment to improve the characteristics when the second potential VDD2 is not greater than the first potential VDD1. More specifically, this output circuit is arranged to shorten the delay time generated when "H" is to be supplied from the output pad unit OUT.

The potential difference detection circuit 50 supplies, as the potential difference detection signal OUT1, "L" (0V) when the second potential VDD2 is higher than the first potential VDD1, and "H" (VDD1) when the second potential VDD2 is not greater than the first potential VDD1.

Accordingly, when the second potential VDD2 is higher than the first potential VDD1, the N-MOS transistors 62, 64 are turned off. Thus, no bypass is formed between the nodes A and C and between the nodes B and D. On the other hand, when the second potential VDD2 is not greater than the first potential VDD1, the N-MOS transistors 62, 64 are turned on. Thus, a bypass composed of the N-MOS transistors 61, 62 is formed between the nodes A and C, and a bypass composed of the N-MOS transistors 63, 64 is formed between the nodes B and D.

When "H" is to be supplied from the output pad unit OUT, the potential of the node B (pull-up control signal $S_u$) falls. At this time, however, the potential of the node B is pulled down by the bypass composed of the N-MOS transistors 63, 64. Accordingly, this potential falls faster than in the output circuit in FIG. 5 where no bypass is formed and such potential is pulled down only by the P-MOS transistor 26. Further, the potential of the node B which is in the "L" state, changes from (VDD3+|VTP'|V to 0V. In the P-MOS transistor 31 of the pull-up circuit 30, the gate potential becomes 0V. Accordingly, the voltage across the gate and the source is increased to increase the drain current. Thus, because the potential of the node B falls faster and the drain current of the P-MOS transistor 31 is increased, there is shortened the delay time generated when "H" is to be supplied from the output pad unit OUT.

Figure 11:
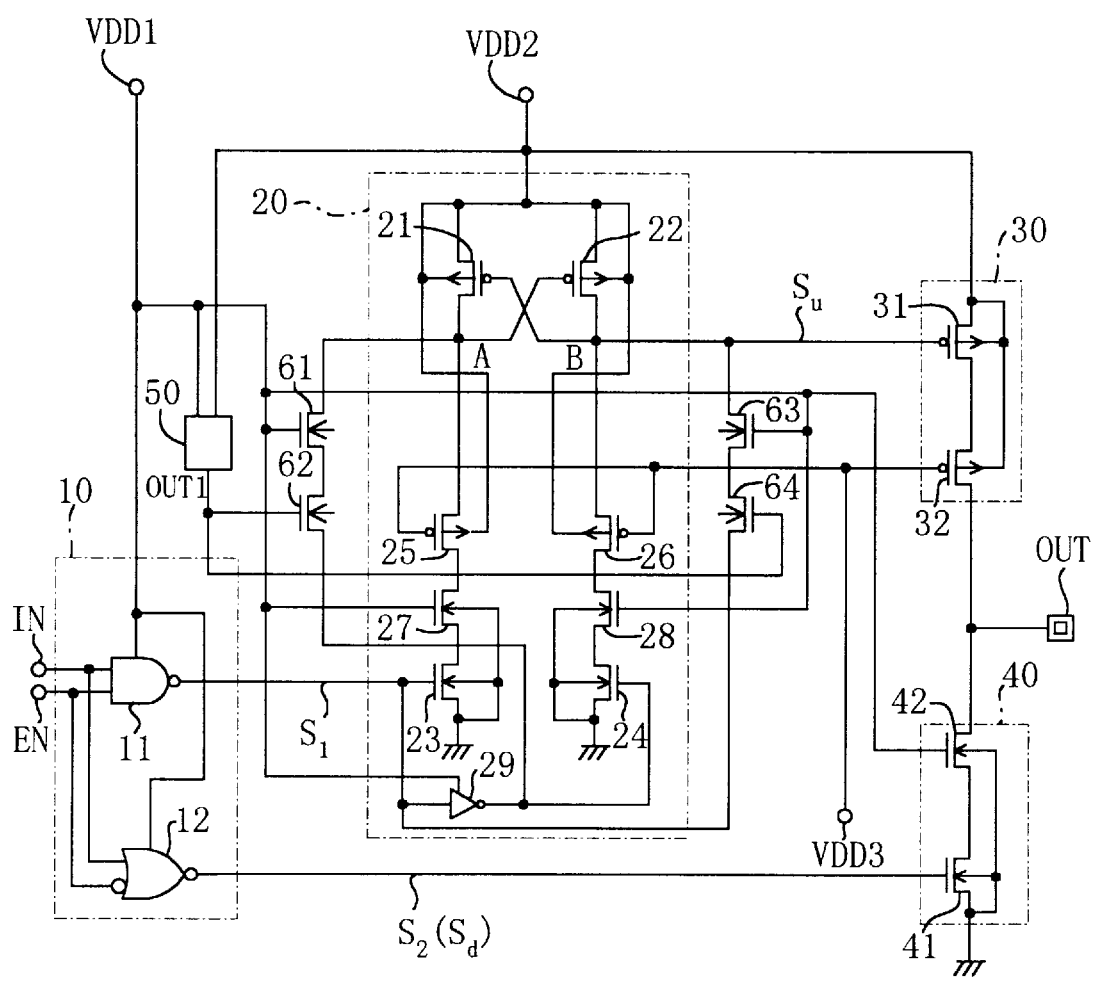
FIG. 11 is a circuit diagram illustrating the arrangement of a modification of the output circuit according to the fourth embodiment of the present invention.

FIG. 11 is a circuit diagram illustrating the arrangement of a modification of the output circuit according to the fourth embodiment. The output circuit in FIG. 11 is different from the output circuit in FIG. 10 in that the N-MOS transistors 61, 62 are connected in series between the node A and the output line of the inverter circuit 29 and that the N-MOS transistors 63, 64 are connected in series between the node B and the input line of the inverter circuit 29.

When the second potential VDD2 is not greater than the first potential VDD1, the N-MOS transistors 62, 64 are turned on. Accordingly, a bypass composed of the N-MOS transistors 61, 62 is formed between the node A and the output line of the inverter circuit 29, and a bypass composed of the N-MOS transistors 63, 64 is formed between the node B and the input line of the inverter circuit 29.

When "H" is to be supplied from the output pad unit OUT, the potential of the node A becomes "H" and the potential of the node B (pull-up control signal $S_u$) becomes "L". However, the first control signal $S_1$ supplied from the signal generation circuit 10 is in the "L" state. Therefore, the output signal of the inverter circuit 29 becomes "H" and the potential of the node A is pulled up through the bypass. This shortens the delay time before the potential of the node A becomes "H". Thus, the output circuit operates at higher speed than that of the output circuit shown in FIG. 10.

Figure 12:
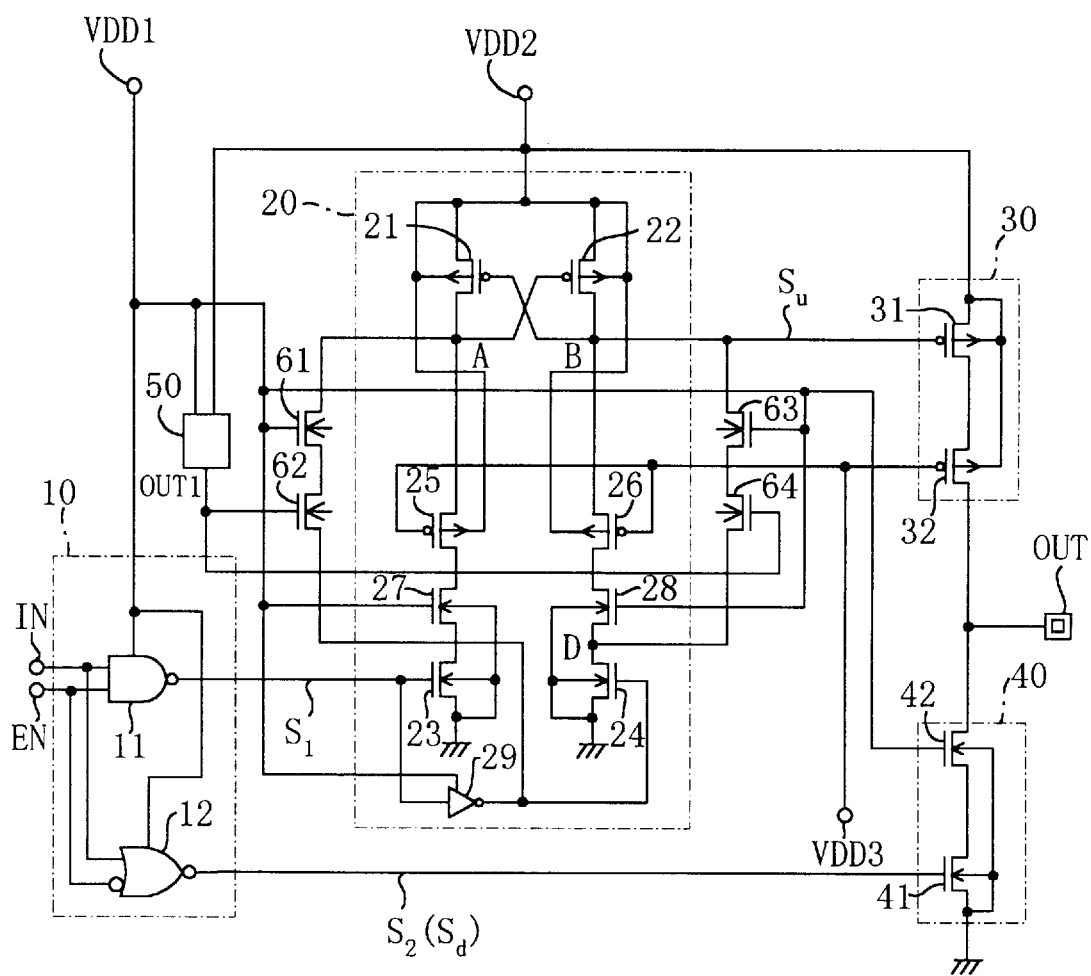
FIG. 12 is a circuit diagram illustrating the arrangement of another modification of the output circuit according to the fourth embodiment of the present invention.

FIG. 12 is a circuit diagram illustrating another modification of the output circuit according to the fourth embodiment, which is a compromise between the arrangement in FIG. 10 and the arrangement in FIG. 11. In FIG. 12, N-MOS transistors 61, 62 are connected in series between the node A and the output line of the inverter circuit 29 as done in FIG. 11, and N-MOS transistors 63, 64 are connected in series between the nodes B and D.

We claim:

1. An output circuit arranged to receive an output signal from one circuit having a first potential as its power potential and to supply, according to the output signal thus received, a signal from the output unit thereof to another circuit having a second potential as its power potential, said output circuit comprising:

a signal generation circuit for generating, based on the output signal entered from said one circuit, first and second control signals each having an amplitude equal to the difference between said first potential and a grounding potential;

a voltage conversion circuit for receiving said first control signal generated by said signal generation circuit, and for converting the amplitude of said first control signal to generate and supply a pull-up control signal;

a potential difference detection circuit for detecting the difference between said first potential and said second potential and for supplying a potential difference detection signal indicative of whether or not said second potential is greater than said first potential;

a switch circuit to which both a predetermined potential and the grounding potential are given and to which said potential difference detection signal supplied from said potential difference detection circuit is entered;

a pull-up circuit arranged to receive said pull-up control signal supplied from the voltage conversion circuit and to pull up or not pull up the potential of said output unit to said second potential dependent on the instruction of said pull-up control signal;

a pull-down circuit arranged to receive, as a pull-down control signal, said second control signal generated by said signal generation circuit and to pull down or not pull down the potential of said output unit to the grounding potential dependent on the instruction of said pull-down control signal, said pull-up circuit comprising:

a first P-MOS transistor to the source of which said second potential is coupled and to the gate of which said pull-up control signal is entered; and a second P-MOS transistor having a source connected to the drain of said first P-MOS transistor, a drain connected to said output unit, and a gate to which a third potential is applied, said pull-down circuit comprising:

a first N-MOS transistor of which the source is grounded and to the gate of which said pull-down control signal is entered; and a second N-MOS transistor having a source connected to the drain of said first N-MOS transistor, a drain connected to said output unit, and a gate to which said first potential is applied, said voltage conversion circuit being arranged such that, when said pull-up circuit is so instructed as to pull up the potential of said output unit to said second potential, the potential of said pull-up control signal is brought to a potential which is not greater than a potential obtained by subtracting the threshold voltage of said first P-MOS transistor from said second potential and which is not less than the potential obtained by subtracting a voltage equivalent to the withstand voltage of a gate oxide layer of said first P-MOS transistor from said second potential, and that when said pull-up circuit is not so instructed as to pull up said potential of said output unit to said second potential, the potential of said pull-up control signal is brought to said second potential, said switch circuit being arranged (i) to selectively supply said predetermined potential when said potential difference detection signal indicates that said second potential is greater than said first potential, and (ii) to selectively supply said grounding potential when said potential difference detection signal indicates that said second potential is not greater than said first potential, said output potential of said switch circuit being equal to said third potential.

2. An output circuit according to claim 1, wherein:

the substrate potential of each of said first and second P-MOS transistors is equal to said second potential; and the substrate potential of each of said first and second N-MOS transistors is equal to the grounding potential.

3. An output circuit according to claim 1, wherein said voltage conversion circuit comprises:

third and fourth P-MOS transistors to the sources of which said second potential is given;

a fifth P-MOS transistor of which source is connected to the drain of said third P-MOS transistor;

a sixth P-MOS transistor of which source is connected to the drain of said fourth P-MOS transistor;

a third N-MOS transistor of which drain is connected to the drain of said sixth P-MOS transistor;

a fourth N-MOS transistor of which drain is connected to the source of said third N-MOS transistor and of which source is grounded;

a fifth N-MOS transistor of which drain is connected to the drain of said fifth P-MOS transistor; and a sixth N-MOS transistor of which drain is connected to the source of said fifth N-MOS transistor and of which source is grounded, the gate of said third P-MOS transistor being connected to the drain of said fourth P-MOS transistor, the gate of said fifth P-MOS transistor being connected to the drain of said third P-MOS transistor, said third potential being applied to the gates of said fifth and sixth P-MOS transistors, said first potential being applied to the gates of said third and fifth N-MOS transistors;

said first control signal generated by said signal generation circuit being entered into the gate of said sixth N-MOS transistor, an inversion signal of said first control signal being entered into the gate of said fifth N-MOS transistor, said pull-up control signal being supplied from the node where the drain of said fourth P-MOS transistor is being connected to the source of said sixth P-MOS transistor.

4. An output circuit according to claim 3, wherein:

the substrate potential of each of said third, fourth, fifth and sixth P-MOS transistors is equal to said second potential; and the substrate potential of each of said third, fourth, fifth and sixth N-MOS transistors is equal to the grounding potential.

5. An output circuit according to claim 1, wherein said voltage conversion circuit comprises:

third and fourth P-MOS transistors to the sources of which said second potential is given;

a fifth P-MOS transistor of which the source is connected to the drain of said third P-MOS transistor;

a sixth P-MOS transistor of which the source is connected to the drain of said fourth P-MOS transistor;

a third N-MOS transistor of which the drain is connected to the drain of said sixth P-MOS transistor;

a fourth N-MOS transistor of which the drain is connected to the source of said third N-MOS transistor and of which source is grounded; and a fifth N-MOS transistor of which the drain is connected to the drain of said fifth P-MOS transistor, the gate of said third P-MOS transistor being connected to the drain of said fourth P-MOS transistor, the gate of said fourth P-MOS transistor being connected to the drain of said third P-MOS transistor, said third potential being applied to the gates of said fifth and sixth P-MOS transistors, said first potential being applied to the gates of said third and fifth N-MOS transistors, said first control signal generated by said signal generation circuit being inverted and input into the gate of said fourth N-MOS transistor and to the source of said fifth N-MOS transistor, said pull-up control signal being supplied from the node where the drain of said fourth P-MOS transistor is being connected to the source of said sixth P-MOS transistor.

6. An output circuit according to claim 5, wherein:

the substrate potential of each of said third, fourth, fifth and sixth P-MOS transistors is equal to said second potential; and the substrate potential of each of said third, fourth and fifth N-MOS transistors is equal to the grounding potential.

7. An output circuit according to any of claims 1, 3 or 5 wherein said third potential is equal to said first potential.

8. An output circuit according to claim 1, wherein said predetermined potential is not greater than said first potential and is not less than a potential obtained by subtracting a voltage equivalent to the withstand voltage of the gate oxide layer of said first P-MOS transistor from said second potential.

9. An output circuit according to claim 1, wherein said potential difference detection circuit comprises:

a seventh P-MOS transistor to the source of which said second potential is given and to the gate of which said first potential is applied;

an eighth P-MOS transistor to the drain of which said first potential is given;

a seventh N-MOS transistor of which source is connected to the drain of said seventh P-MOS transistor;

an eighth N-MOS transistor of which drain is connected to the source of said seventh N-MOS transistor and of which source is grounded;

a ninth N-MOS transistor of which drain is connected to the drain of said eighth P-MOS transistor and of which source is grounded; and a tenth N-MOS transistor to the source of which said first potential is given, to the gate of which said second potential is applied, and of which drain is connected to the gate of said eighth P-MOS transistor, the gate of said eighth N-MOS transistor being connected to the drain of said ninth N-MOS transistor, the gate of said ninth N-MOS transistor being connected to the drain of said eight N-MOS transistor, said potential difference detection signal being supplied from the node where said drain of said eighth P-MOS transistor is being connected to the drain of said ninth N-MOS transistor.

10. An output circuit according to claim 9, wherein:

the substrate potential of each of said seventh and eighth P-MOS transistors is equal to said second potential; and the substrate potential of each of said seventh, eighth, ninth and tenth N-MOS transistors is equal to the grounding potential.

11. An output circuit arranged to receive an output signal from one circuit having a first potential as its power potential and to supply, according to the output signal thus received, a signal from the output unit thereof to another circuit having a second potential as its power potential, said output circuit comprising:

a signal generation circuit for generating, based on the output signal entered from said one circuit, first and second control signals each having an amplitude equal to the difference between said first potential and a grounding potential;

a voltage conversion circuit for receiving said first control signal generated by said signal generation circuit, and for converting the amplitude of said first control signal to generate and supply a pull-up control signal;

a potential difference detection circuit for detecting the difference between said first potential and said second potential and for supplying a potential difference detection signal indicative of whether or not said second potential is greater than said first potential;

a voltage conversion acceleration circuit into which said potential difference detection signal supplied from said potential difference detection circuit is entered, and which is arranged (i) to accelerate the operating speed of said voltage conversion circuit when said potential difference detection signal indicates that said second potential is greater than said first potential, and (ii) not to accelerate the operating speed of said voltage conversion circuit when said potential difference detection signal indicates that said second potential is not greater than said first potential;

a pull-up circuit arranged to receive said pull-up control signal supplied from the voltage conversion circuit and to pull up or not pull up the potential of said output unit to said second potential dependent on the instruction of said pull-up control signal; and a pull-down circuit arranged to receive, as a pull-down control signal, said second control signal generated by said signal generation circuit and to pull down or not pull down the potential of said output unit to the grounding potential dependent on the instruction of said pull-down control signal, said pull-up circuit comprising:

a first P-MOS transistor to the source of which said second potential is given and to the gate of which said pull-up control signal is entered; and a second P-MOS transistor having a source connected to the drain of said first P-MOS transistor, a drain connected to said output unit, and a gate to which a third potential is applied, said pull-down circuit comprising:

a first N-MOS transistor of which source is grounded and to the gate of which said pull-down control signal is entered; and a second N-MOS transistor having a source connected to the drain of said first N-MOS transistor, a drain connected to said output unit, and a gate to which said first potential is applied, said voltage conversion circuit being arranged such that, when said pull-up circuit is so instructed as to pull up the potential of said output unit to said second potential, the potential of said pull-up control signal is brought to a potential which is not greater than a potential obtained by subtracting the threshold voltage of said first P-MOS transistor from said second potential and which is not less than the potential obtained by subtracting a voltage equivalent to the withstand voltage of a gate oxide layer of said first P-MOS transistor from said second potential, and that when said pull-up circuit is not so instructed as to pull up said potential of said output unit to said second potential, the potential of said pull-up control signal is brought to said second potential.

12. An output circuit according to claim 11, wherein said voltage conversion circuit comprises:

third and fourth P-MOS transistors to the sources of which said second potential is given;

a fifth P-MOS transistor of which source is connected to the drain of said third P-MOS transistor;

a sixth P-MOS transistor of which source is connected to the drain of said fourth P-MOS transistor;

a third N-MOS transistor of which drain is connected to the drain of said sixth P-MOS transistor;

a fourth N-MOS transistor of which drain is connected to the source of said third N-MOS transistor and of which source is grounded;

a fifth N-MOS transistor of which drain is connected to the drain of said fifth P-MOS transistor; and a sixth N-MOS transistor of which drain is connected to the source of said fifth N-MOS transistor and of which source is grounded, the gate of said third P-MOS transistor being connected to the drain of said fourth P-MOS transistor, the gate of said fourth P-MOS transistor being connected to the drain of said third P-MOS transistor, said third potential being applied to the gates of said fifth and sixth P-MOS transistors, said first potential being applied to the gates of said third and fifth N-MOS transistors;

said first control signal generated by said signal generation circuit being entered into the gate of said sixth N-MOS transistor, an inversion signal of said first control signal being entered into the gate of said fifth N-MOS transistor, said pull-up control signal being supplied from the node where the drain of said fourth P-MOS transistor is being connected to the source of said sixth P-MOS transistor, and said voltage conversion acceleration circuit comprises;

an eleventh N-MOS transistor of which drain is connected to the drain of said third P-MOS transistor;

a twelfth N-MOS transistor of which drain is connected to the source of said eleventh N-MOS transistor, and of which source is connected to the drain of said sixth N-MOS transistor;

a thirteenth N-MOS transistor of which drain is connected to the drain of said fourth N-MOS transistor; and a fourteenth N-MOS transistor of which drain is connected to the source of said thirteenth N-MOS transistor, and of which source is connected to the drain of said fourth N-MOS transistor, said first potential being applied to the gates of said eleventh and thirteenth N-MOS transistors, said potential difference detection signal being entered into the gates of said twelfth and fourteenth N-MOS transistors, said potential difference detection circuit being arranged to supply said first potential as said potential difference detection signal when said potential is greater than said first potential and to supply the grounding potential as said potential difference detection signal when said second potential is not greater than said first potential.

13. An output circuit according to claim 12, wherein the source of said twelfth N-MOS transistor is not connected to the drain of said sixth N-MOS transistor, but an inversion signal of said first control signal is entered thereinto.

14. An output circuit according to claim 13, wherein the source of said fourteenth N-MOS transistor is not connected to the drain of said fourth N-MOS transistor, but said first control signal is entered thereinto.

* * * * *

UNITED STATES PATENT AND TRADEMARK OFFICE
CERTIFICATE OF CORRECTION

PATENT NO.   : 5,834,948
DATED        : November 10, 1998
INVENTOR(S)  : Yoshizaki et al.

It is certified that error appears in the above-identified patent and that said Letters Patent is hereby corrected as shown below:

Column 23,
Line 57, change "source" to -- drain --; and
Line 59, change "drain" to -- source --.

Signed and Sealed this

Sixth Day of August, 2002

*Attest:*

*Attesting Officer*

JAMES E. ROGAN
*Director of the United States Patent and Trademark Office*